(12) United States Patent
Kitagawa et al.

(10) Patent No.: US 8,587,986 B2
(45) Date of Patent: Nov. 19, 2013

(54) VARIABLE-RESISTANCE MEMORY DEVICE AND ITS DRIVING METHOD

(75) Inventors: Makoto Kitagawa, Kanagawa (JP); Kentaro Ogata, Nagasaki (JP)

(73) Assignee: Sony Corporation, Tokyo (JP)

( * ) Notice: Subject to any disclaimer, the term of this patent is extended or adjusted under 35 U.S.C. 154(b) by 240 days.

(21) Appl. No.: 13/067,830

(22) Filed: Jun. 29, 2011

(65) Prior Publication Data

US 2012/0020141 A1 Jan. 26, 2012

(30) Foreign Application Priority Data

Jul. 21, 2010 (JP) ................................. 2010-164380

(51) Int. Cl.
*G11C 11/00* (2006.01)
(52) U.S. Cl.
USPC ...................................... 365/148; 365/189.16
(58) Field of Classification Search
USPC ............................................ 365/148, 189.16
See application file for complete search history.

(56) References Cited

U.S. PATENT DOCUMENTS

2004/0174756 A1* 9/2004 Kunikiyo et al. .............. 365/200
2010/0182820 A1* 7/2010 Kitagawa et al. .............. 365/148

FOREIGN PATENT DOCUMENTS

JP 2007-015358 2/2007

OTHER PUBLICATIONS

K. Tsunoda et al., "Low Power and High Speed Switching of Ti-doped NiO ReRAM under the Unipolar Voltage Scource of less than 3 V," Fujitsu Laboratories Ltd., 2007 IEEE, pp. 767-770.
K. Aratani et al, "A Novel Resistance Memory with High Scalability and Nanosecond Switching," Solid State Memories Research Laboratory, 2007 IEEE, pp. 783-786.

* cited by examiner

*Primary Examiner* — Hoai V Ho
(74) *Attorney, Agent, or Firm* — Sony Corporation

(57) ABSTRACT

A variable-resistance memory device includes: a memory cell including a memory element being variable in resistance in accordance with a polarity of an application voltage applied to the memory element in a set or reset operation and an access transistor connected to the memory element in series between first and second common lines; and a driving circuit including a first path transistor connected between a first supply line for supplying a first voltage and the first common line as well as a second path transistor connected between a second supply line for supplying a second voltage and the first common line.

19 Claims, 24 Drawing Sheets

RESET START TIME
(BEFORE INCREASING
THE RESISTANCE:LRS)

$V(cell) = (Vgrst - Vgs) * \dfrac{Rcell}{(Rcell + Rmos)}$

RESET END TIME
(AFTER INCREASING
THE RESISTANCE:HRS)

$V(cell) = (Vgrst - Vgs) * \dfrac{Rcell}{(Rcell + Rmos)}$

VARIABLE-RESISTANCE MEMORY DEVICE AND ITS DRIVING METHOD

BACKGROUND

The present disclosure relates to a variable-resistance memory device and its driving method. The variable-resistance memory device employs memory cells each including a memory element and an access transistor connected in series to the memory element. The memory element has a resistance varying in accordance with a voltage applied to the memory element.

There is known a variable-resistance memory device having a resistance varying in accordance with a voltage applied between electrodes separated away from each other by an insulation layer serving as a storage layer of the variable-resistance memory device. More information on this variable-resistance memory device is described in documents such as "K. Tsunoda, et al., 'Low Power and High Speed Switching of Ti-doped NiO ReRAM under the Unipolar Voltage Source of less than 3 V,' 2007 IEEE, pp. 267-270" and "K. Aratani, et al., 'A Novel Resistance Memory with High Scalability and Nanosecond Switching,' Technical Digest IEDM 2007, pp. 783-786" (hereinafter referred to as Non-Patent Documents 1 and 2). In particular, Non-Patent Document 1 discloses a memory making use of a transition metal oxide for making the insulation layer.

On the other hand, Non-Patent Document 2 discloses a memory created by laminating a conductive-ion supplying layer on an insulation layer serving as a storage layer between two electrodes. The memory employs memory cells each having a memory element and an access transistor connected to the memory element in series between first and second common lines which can be driven by adoption of an active-matrix driving method.

Since such a memory cell thus has one transistor T and a variable resistor R of the memory element, the memory is one of current-driven memories of the 1T1R type. This memory is referred to as a ReRAM.

In the ReRAM, the magnitude of the resistance of the memory element indicates whether data has been written into the memory element or deleted from the memory element. A pulse with a short duration time of the nanosecond order can be used for carrying out an operation to write data into the memory element or erase data from the memory element. Thus, serving as an NVM (nonvolatile memory) capable of operating at a high speed like a RAM (Random Access Memory), the ReRAM draws much attention.

In order for the ReRAM to be able to serve as a replacement for the flash memory which is the contemporary FG (Floating Gate)_NAND NVM, however, there are some barriers to surmount. One of the barriers is the fact that the data write/erase characteristic of the memory cell of the ReRAM is dependent on the number of data rewriting operations already carried out on the memory cell. For this reason, in accordance with the number of already performed data rewriting operations, proper operating conditions for applying a voltage to the memory cell are changed.

That is to say, if the operating conditions such as the frequency of the data rewriting operation are changed, stress caused by a data rewriting current/voltage as stress necessary and sufficient for the memory cell also changes as well. Excessively large stress caused by a data rewriting current/voltage increases a leak and changes the number of allowable data rewriting operations or, to be more specific, reduces the number of allowable data rewriting operations. Thus, excessively large stress is not desirable.

In other words, the ReRAM is capable of both guaranteeing the upper limit of the number of data rewriting operations and sustaining the data holding characteristic provided that stress caused by a data rewriting current/voltage as stress necessary and sufficient from time to time is given to the memory cell.

In the ReRAM field, as a technique for applying a proper current or voltage, there is known a technology for controlling a voltage applied to the gate electrode of the access transistor. More information on this technology is described in Non-Patent Document 1.

In accordance with the technique proposed in Non-Patent Document 1, the voltage applied to the gate electrode of the access transistor is adjusted in order to control the magnitude of a current flowing through the memory element as a current for making the resistance of the memory element small or large.

There are also known an MRAM making use of a TMR (Tunnel Magneto Resistance) effect and a variable-magnetism memory adopting a spin injection method. The variable-magnetism memory makes use of a physical phenomenon different from that of the ReRAM. In addition, the variable-magnetism memory and the ReRAM are similar to each other in that both the memories are a current driven memory having the 1T1R type in which every memory cell consists of a memory element and an access transistor.

In the fields of the MRAM and the memory adopting the spin injection method, there is known a technology for controlling a current applied in data writing and erasing operations by making use of a write line decoder. More information on this technology is described in documents such as PCT Patent Publication No. WO2007/015358 (hereinafter referred to as Patent Document 1).

FIG. 1 is a diagram showing the basic configuration of a write line decoder 200 shown in FIG. 4 of Patent Document 1.

The write line decoder 200 shown in the figure has six NMOS transistors N1 to N6 and three inverters INV1 to INV3.

The NMOS transistors N1 and N2 are connected to each other in series. The source electrode of the NMOS transistor N2 is connected to the ground. By the same token, the NMOS transistors N3 and N4 are connected to each other in series. The source electrode of the NMOS transistor N4 is connected to the ground.

An external write-current generation circuit 400 is capable of supplying a write current IW to the drain electrodes of the NMOS transistors N1 and N3.

A point connecting the NMOS transistor N1 to the NMOS transistor N2 is connected to a write line 210 through the NMOS transistor N5 serving as a column switch. By the same token, a point connecting the NMOS transistor N3 to the NMOS transistor N4 is connected to a write line 220 through the NMOS transistor N6 serving as a column switch.

A magnetic resistance element MRE is connected between the write lines 210 and 220 through a select transistor not shown in the figure. The current flowing through the magnetic resistance element MRE is controlled by inversion of the magnetization in a layer having free magnetic domains in accordance with the direction of the flowing current. That is to say, the resistance of the magnetic resistance element MRE is controlled.

The direction of the write current IW is changed by controlling the gate electrodes of the NMOS transistors N1 to N4 in accordance with a current direction signal DIR supplied by a source outside the write-line decoder 200 and logic generated by the inverters INV1 to INV3.

By carrying out this control, a write current IW1 flows when the NMOS transistors N1 and N4 are put in a turned-on state whereas the NMOS transistors N2 and N3 are put in a turned-off state. On the other hand, a write current IW2 conversely flows when the NMOS transistors N2 and N3 are put in a turned-on state whereas the NMOS transistors N1 and N4 are put in a turned-off state.

As is obvious from the above description, in accordance with Patent Document 1, inside the write-line decoder 200, for every two write lines serving as first and second common lines, a path transistor serving as a current switch is provided. The write-line decoder 200 controls the path transistor to enter a turned-on or turned-off state in order to control an operation to stop and supply the write current input to the write-line decoder 200. In this configuration, the gate electrode of an access transistor may be controlled by a common line to arbitrarily operate to write data into a memory element employed in any of memory cells laid out to form a matrix to serve as memory cells each including the access transistor or erase data from the memory element.

SUMMARY

As described in Non-Patent Document 1 given above, if the access transistor is miniaturized, the characteristics of the infinitesimal transistor having large variations has an effect on the write and erase operations. As a result, in a current control method described in Non-Patent Document 1, the variations of the write and erase characteristics are inevitably large.

It is to be noted that inventors of the present disclosure have proposed a disclosure described in Japanese Patent No. 2009-012385 as one of methods for eliminating the defect of the current control method described in Non-Patent Document 1.

The disclosure is a disclosed method for controlling a write voltage, an erase voltage and a current by adjustment of a voltage applied to the gate electrode of a path transistor connected to a bit line.

In accordance with this method, by raising a voltage applied to the gate electrode of an access transistor in order to carry out a low-impedance operation, instead, the voltage applied to the gate electrode of the path transistor having a large constant (size) is controlled. Thus, this method has a merit that variations of write and erase characteristics can be reduced.

In the method described in the previous application for a patent, the write and erase operations share the path transistor. Thus, the method still has an area for improvement in that it is impossible to carry out current driving for write and erase operations at the same time by making use of a plurality of bit lines for a plurality of memory cells on a row of memory cells sharing the same word line. As a result, this method needs to be implemented on a time division basis. If this method is implemented on a time division basis, however, there will be a barrier against efforts to increase the speed.

If the direction of a flowing cell current can be controlled arbitrarily by making use of a plurality of common lines such as bit and source lines, the problem described as the area for improvement can be solved.

In the ReRAM and the like, however, in order to control the direction of the cell current, it is impossible to uniformly adopt a method for supplying the current by way of a current switch such as one described in Patent Document 1.

As described in Patent Document 1, the NMOS transistor N1 or N3 shown in FIG. 1 receives a write current IW supplied to the drain electrode and outputs the write current IW from the source electrode. Thus, the saturation characteristic of the drain current of the NMOS transistor N1 or N3 is used. Accordingly, the NMOS transistor N1 or N3 functions a voltage limiter.

Since the change of the resistance of a spin injection memory is very small in comparison with that of the ReRAM, an operating point defined as an intersection of a drain current curve and a load straight line in the drain current characteristic makes a transition in a drain saturation area.

On the other hand, changes of the resistance of a variable-resistance memory such as the ReRAM are greater than those of the spin injection memory by several digits. Thus, when the resistance of the memory element employed in a variable-resistance memory such as the ReRAM changes from a small value to a large value, the operating point makes a transition to the unsaturated area of the drain current curve. Thus, when the operating point makes a transition at an initial stage of an operating pulse, the memory element in a state of having a large resistance is exposed to large voltage stress during a period ending on the falling edge of the operating pulse. As explained earlier, the characteristic of the ReRAM particularly changes with ease due to large voltage or current stress. Thus, it is impossible to adopt the write current inversion control, which is described in Patent Document 1, as it is.

The present disclosure is well applicable to the configuration of a 3-line memory cell connected to a row-direction common line referred to as the so-called word line and column-direction common lines referred to as first and second common lines.

In addition, the present disclosure provides a variable-resistance memory device having a driving circuit proper for concurrent driving of set and reset operations in the 3-line memory cell employed in the variable-resistance memory. On top of that, the present disclosure presents a method for driving the variable-resistance memory device.

A variable-resistance memory device according to an embodiment of the present disclosure has a memory cell, a first path transistor, a second path transistor and a driving circuit.

The memory cell includes an access transistor and a memory element being variable in resistance in accordance with a polarity of an application voltage applied to the memory element in a set or reset operation. In the memory cell, the access transistor and the memory element are connected to each other in series between first and second common lines.

The first path transistor is connected between a first supply line for supplying a first voltage and the first common line.

The second path transistor is connected between a second supply line for supplying a second voltage and the first common line.

The driving circuit drives the first path transistor to carry out a drain output operation when the application voltage is applied to the memory element to execute the set operation. On the other hand, the driving circuit drives the second path transistor to carry out a source follower operation when the application voltage is applied to the memory element to execute the reset operation. The driving circuit switches the operation of the memory cell from the drain output operation to the source follower operation and vice versa by controlling a voltage applied to the gate electrode of the first path transistor, a voltage applied to the gate electrode of the second path transistor and a voltage appearing on the second common line.

In accordance with the configuration described above, the driving circuit is capable of switching the operation of the memory cell from the drain output operation carried out by first path transistor for the first common line to the source follower operation carried out by second path transistor for the same first common line and vice versa. The driving circuit switches the operation of the memory cell from the drain output operation carried out by first path transistor to the source follower operation carried out by second path transistor and vice versa in order to change bias setting from a bias applied to the memory element for the set operation to a bias applied to the memory element for the reset operation and vice versa.

The configuration described above is proper for an array of a plurality of memory cells which have access transistors controlled at the same time and each have the first and second common lines as well as the first and second path transistors. In this configuration, the first and second path transistors are provided for every common-line pair consisting of the first and second common lines or, in other words, for every memory cell. Thus, for any arbitrary memory cells in the memory-cell array, set and reset operations can be carried out at the same time.

A method for driving a variable-resistance memory device having memory cells in accordance with an embodiment of the present disclosure is a method for driving the memory cells each including a memory element being variable in resistance in accordance with a polarity of an application voltage applied to the memory element in a set or reset operation and including an access transistor connected in series to the memory element between first and second common lines. In this method for driving a variable-resistance memory device, a driving path of the first common lines includes a path having a first path transistor and a path having a second path transistor. In accordance with this method for driving a variable-resistance memory device, a voltage applied to the gate electrode of the first path transistor, a voltage applied to the gate electrode of the second path transistor and a voltage appearing on the second common line are controlled so that the first path transistor carries out a drain output operation when the application voltage is applied to the memory element to execute the set operation and the second path transistor carries out a source follower operation when the application voltage is applied to the memory element to execute the reset operation.

In accordance with the present disclosure, there is provided a variable-resistance memory device such as the ReRAM having a driving circuit proper for concurrent driving of set and reset operations in a plurality of a-line memory cells included in the variable-resistance memory device as memory cells having their access transistors controlled at the same time.

In addition, in accordance with the present disclosure, there is also provided a driving method proper for concurrent driving of set and reset operations in a plurality of 3-line memory cells having their access transistors controlled at the same time.

BRIEF DESCRIPTION OF THE DRAWINGS

FIGS. 13A1 to 13F4 are diagrams showing operation waveforms common to the first and second embodiments;

DETAILED DESCRIPTION OF THE PREFERRED EMBODIMENTS

Embodiments of the present disclosure are explained for typical cases in which the memory element is a memory element employed in the ReRAM in chapters arranged as follows.

1: First Embodiment (implementing a configuration in which first and second path transistors are NMOS transistors)
2: Second Embodiment (implementing a configuration in which first and second path transistors are PMOS transistors)

1: First Embodiment

Configuration of the Memory Cell

Figure 2A:
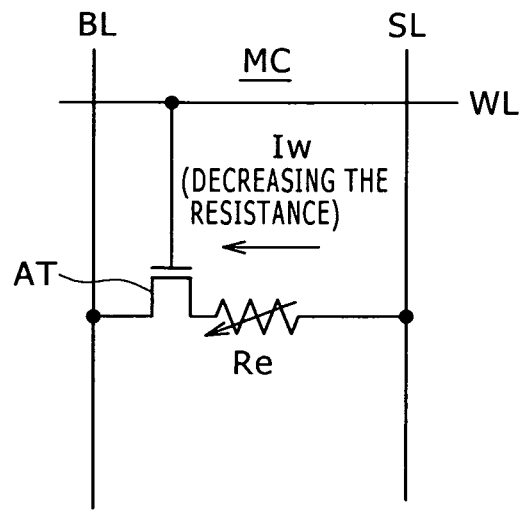
FIGS. 2A and 2B are a plurality of diagrams each showing an equivalent circuit of a memory cell common to embodiments.
Figure 2B:
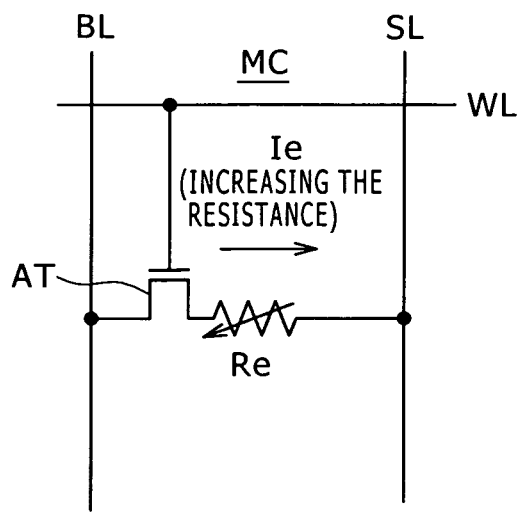

FIGS. 2A and 2B are diagrams each showing an equivalent circuit of a memory cell common to embodiments of the present disclosure. It is to be noted that FIG. 2A shows a write current whereas FIG. 2B shows an erase current. However, the memory-cell configurations themselves shown in the figures are identical to each other.

The memory cell MC shown in FIGS. 2A and 2B employs a variable-resistance element Re functioning as a memory element and an access transistor AT.

One of the two ends of the variable-resistance element Re is connected to a source line SL whereas the other end is connected to the source electrode of the access transistor AT. The drain electrode of the access transistor AT is connected to a bit line BL whereas the gate electrode of the access transistor AT is connected to a word line WL.

The bit line BL and the source line SL are a typical first common line and a typical second common line respectively.

In the configuration shown in FIGS. 2A and 2B, the bit line BL and the source line SL are parallel to each other. It is to be noted, however, that the bit line BL and the source line SL do not have to be parallel to each other. Nevertheless, it is desirable to have the bit line BL and the source line SL parallel to each other. This is because, as will be described later, the voltages applied to the bit line BL and the source line SL are controlled by the same driving circuit.

In the first embodiment, in a 3-line configuration given as a prerequisite, as described above, the memory cell MC is connected to three lines, i.e., the bit line BL serving as the first common line, the source line SL serving as the second common line and the word line WL serving as a common line for controlling the access transistor AT.

Figure 3:
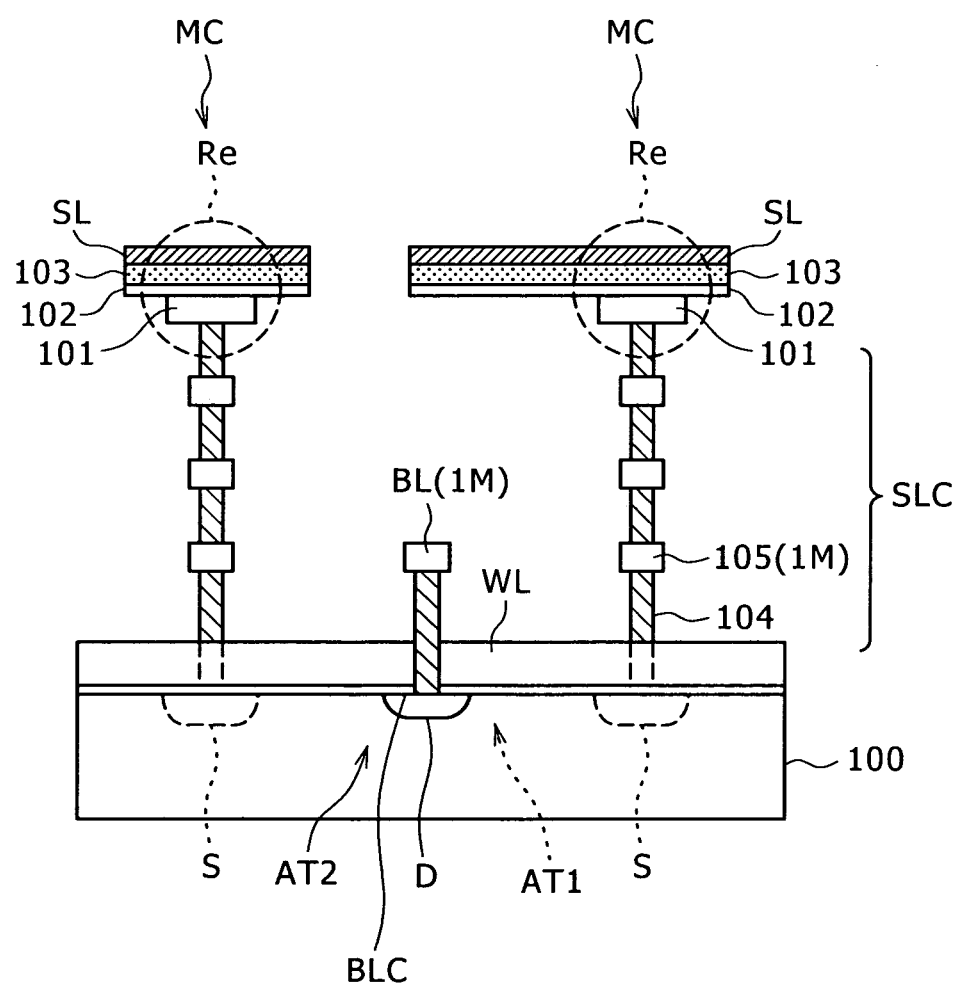
FIG. 3 is a cross-sectional diagram showing the structure of two adjacent memory cells of a variable-resistance memory device.

FIG. 3 is a cross-sectional diagram showing the structure of two adjacent memory cells MC of a variable-resistance memory device. FIG. 3 is a model cross-sectional diagram showing no hatched portions. Blank portions of FIG. 3 are portions filled up with insulation films or other configuration portions even though the figure does not indicate so.

In the memory cell MC shown in FIG. 3, the access transistor AT of the memory cell MC is created on a substrate 100.

To put it in detail, two impurity areas serving as the source electrode S of the access transistor AT and the drain electrode D of the access transistor AT respectively are created on the substrate 100 whereas a gate electrode G is created from poly-silicon or the like on a gate substrate area between the source electrode S and the drain electrode D. The gate electrode G is separated away from the gate area on the substrate 100 by a gate insulation film. The gate electrode G forms a word line WL stretched in the row direction, that is, the horizontal direction in FIG. 3. The impurity area used as the drain electrode D is placed on the front side of the word line WL whereas the impurity area used as the source electrode S is placed on the rear side of the word line WL. The front side of the word line WL is the front side in a direction perpendicular to the surface of the page showing the diagram whereas the rear side of the word line WL is the rear side in a direction perpendicular to the surface of the page showing the diagram. In FIG. 3, the positions of the impurity area used as the drain electrode D and the impurity area used as the source electrode S are shifted from each other in the horizontal direction in order to make the drain electrode D and the source electrode S easy to identify.

However, the positions of the impurity area used as the drain electrode D and the impurity area used as the source electrode S can also overlap each other in a direction perpendicular to the surface of the page showing the diagram.

The drain electrode D is connected to the bit line BL created by a first wire layer (1M) through a bit-line contact BLC.

On the source electrode S, a source-line contact SLC is created by repeatedly piling up plugs 104 and landing pads 105. The landing pads 105 are each created from a wire layer. On the source-line contact SLC, the variable-resistance element Re is created.

It is possible to arbitrarily select a layer from a multi-layer wire structure to serve as a layer on which the variable-resistance element Re is to be created. In this case, however, the fourth or fifth layer is selected to serve as a layer on which the variable-resistance element Re is to be created.

The variable-resistance element Re forms a film configuration (or a laminated body) between a lower electrode 101 and a top electrode serving as the source line SL. The film configuration includes an insulation-body film 102 and a conductor film 103.

Typical examples of a material used for making the insulation-body film 102 typically include SiN, $SiO_2$ and $Gd_2O_3$.

Typical examples of a material used for making the conductor film 103 typically include a metal film, an alloy film and a metal compound film. The metal film includes one or more elements selected from Cu, Ag, Zr and Al. A typical alloy film is the CuTe alloy film. It is to be noted that the elements for making the metal film can also be selected from elements other than Cu, Ag, Zr and Al provided that the elements have a property of being easy to ionize. In addition, it is desirable to make use of one or more elements S, Se and Te to serve as elements to be combined with one or more aforementioned elements Cu, Ag, Zr and Al. The conductor film 103 is created as a conductive-ion supplying layer.

FIG. 3 shows two variable-resistance elements Re connected to different source lines SL. The insulation-body films 102 each serving as one of the storage layers of adjacent memory cells MC separated away from each other in the same direction as the bit line BL are created on the same layer. By the same token, the conductive films 103 each serving as one of the conductive-ion supplying layers of these memory cells MC are also created on the same layer. In the same way, the source lines SL of these memory cells MC are also created on the same layer. In addition, as another configuration, the source line SL is shared by memory cells MC separated away from each other in the same direction as the bit line BL whereas the storage layer and the conductive-ion supplying layer are each created independently for every memory cell MC.

It is to be noted that, in the first embodiment, the source line SL is created by a wire layer above the bit line BL. The bit line BL is created by the first wire layer (1M) whereas the source line SL is created by the fourth or fifth wire layer. However, the source line SL can be created by the first wire layer (1M) whereas the bit line BL can be created by the fourth or fifth wire layer. In addition, the wire layers for creating the source line SL and the bit line BL can be selected arbitrarily.

Figure 4A:
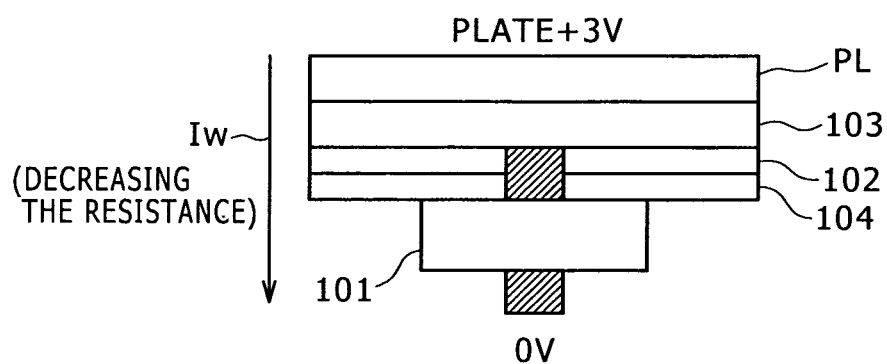
FIGS. 4A and 4B are a plurality of model diagrams each showing the direction of a current flowing through a memory element and a typical magnitude of a voltage applied to the memory element employed in a variable-resistance memory device.
Figure 4B:
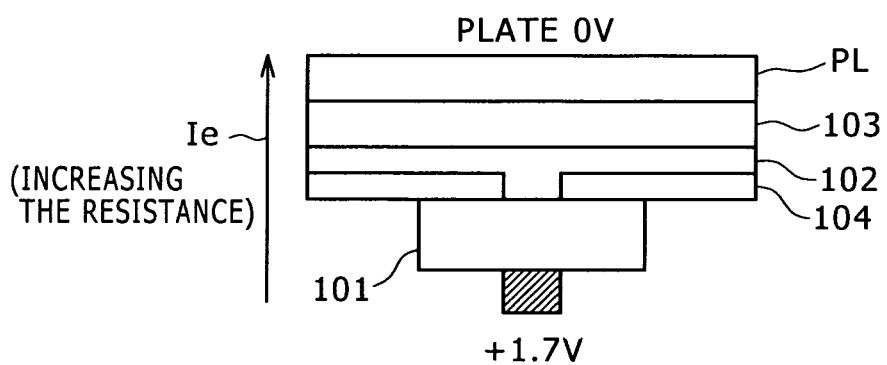

FIGS. 4A and 4B are a plurality of model diagrams each showing the direction of a current flowing through a memory element and a typical magnitude of a voltage applied to the memory element employed in a variable-resistance memory device.

As an example, FIGS. 4A and 4B show a configuration in which the insulation-body film 102 is created from $SiO_2$ whereas the conductor film 103 is created from a Cu—Te based alloy compound material. The insulation-body film 102 has an area of contact with the lower electrode 101. The area of contact is defined by an aperture on a nitride film (or an SiN film) 104.

To be more specific, FIG. 4A shows a case in which a voltage is applied between the lower electrode 101 and the top electrode serving as the source line SL in a direction that puts the insulation-body film 102 on the negative-electrode side and the conductor film 103 on the positive-electrode side. For example, with such a voltage, the bit line BL is connected to the ground having an electric potential of 0 V whereas the source line SL is set at a typical electric potential of +3 V.

Such a state gives rise to a property showing a phenomenon in which Cu, Ag, Zr or Al included in the conductor film 103 is ionized and the resulting ions are attracted to the negative-electrode side. These conductive ions of the metal are injected into the insulation-body film 102. Thus, the insulation power of the insulation-body film 102 decreases and, in consequence, the insulation-body film 102 exhibits a conductive characteristic. As a result, a write current Iw having a direction shown in FIG. 4A flows. This operation is referred to as a write operation or a set operation.

Conversely to what is described above, FIG. 4B shows a case in which a voltage is applied between the lower electrode 101 and the top electrode serving as the source line SL in a direction that puts the conductor film 103 on the negative-electrode side and the insulation-body film 102 on the positive-electrode side. For example, with such a voltage, the source line SL is connected to the ground having an electric potential of 0 V whereas the bit line BL is set at a typical electric potential of +1.7 V.

Such a state gives rise to a phenomenon in which the conductive ions injected into the insulation-body film 102 are returned to the conductor film 103, restoring the resistance to a high pre-write value. This operation is referred to as an erase operation or a reset operation. In the erase or reset operation, an erase current Ie having a direction shown in FIG. 4B flows.

It is to be noted that, in the following description, the set operation is defined as an operation to inject sufficient conductive ions into the insulation-body film whereas the reset operation is defined as an operation to extract sufficient conductive ions from the insulation-body film.

On the other hand, the set operation can be regarded arbitrarily as a data writing operation whereas the reset operation can be regarded arbitrarily as a data erasing operation or vice versa.

In the following description, the set operation is regarded as a data writing operation whereas the reset operation is regarded as a data erasing operation. That is to say, the data writing operation or the set operation is defined as an operation to reduce the insulation property of the insulation-body film 102 so as to decrease the resistance of the entire variable-resistance element Re to a sufficiently low level whereas the data erasing operation or the reset operation is defined as an operation to restore the insulation property of the insulation-body film 102 to the original initial state so as to increase the resistance of the entire variable-resistance element Re to a sufficiently high level.

The current directions indicated by arrows shown in FIGS. 2A and 4A are the directions of the write current Iw flowing through the variable-resistance element Re in the set operation whereas the current directions indicated by arrows shown in FIGS. 2B and 4B are the directions of the erase current Ie flowing through the variable-resistance element Re in the reset operation.

It is thus possible to implement a binary memory on which the set and reset operations described above are repeatedly carried out in order to change the resistance of the variable-resistance element Re from a large value to a small value and vice versa in a reversible manner. On top of that, since the variable-resistance element Re sustains the resistance thereof or data stored therein even if the voltage applied to the variable-resistance element Re is removed, the binary memory functions as a nonvolatile memory.

However, in addition to the binary memory, the present disclosure can also be applied to a multi-value memory such as a memory capable of storing three or more values.

It is to be noted that, in a set operation, the resistance of the insulation-body film 102 changes actually in accordance with the number of metal ions injected into the insulation-body film 102. Thus, the insulation-body film 102 can be regarded as a storage layer used for storing and holding data.

It is possible to configure a memory-cell array of a variable-resistance memory device to include a number of memory cells MC each employing a variable-resistance element Re. The variable-resistance memory device itself is configured to include the memory-cell array and a driving circuit also referred to as a peripheral circuit.

Configuration of the IC Chip

Figure 5:
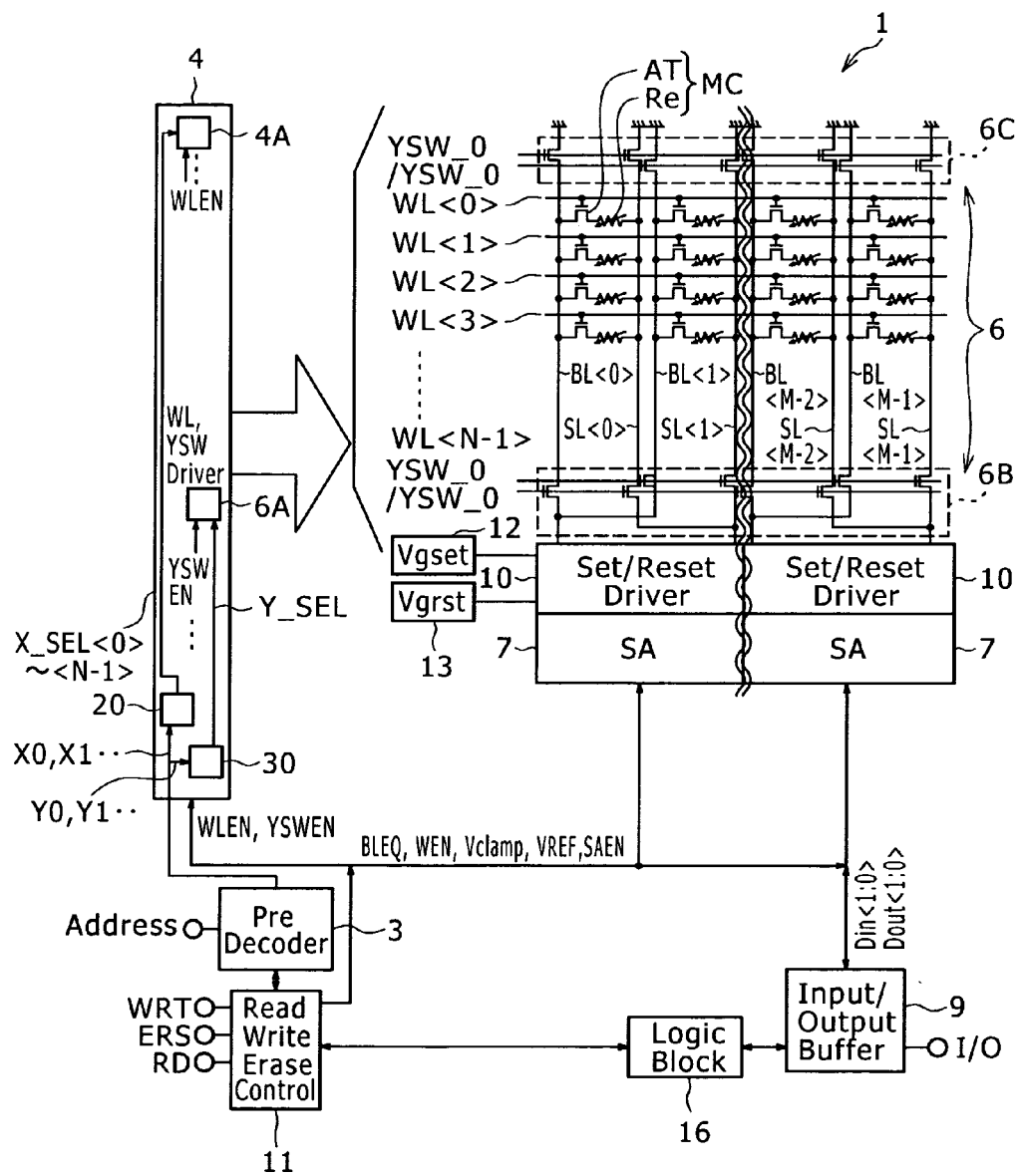
FIG. 5 is a block diagram showing a variable-resistance memory device.

FIG. 5 is a block diagram showing a variable-resistance memory device implemented typically as an IC chip.

The variable-resistance memory device shown in FIG. 5 employs a memory-cell array 1 and its peripheral circuit which are integrated in the same semiconductor chip. The memory-cell array 1 is constructed by arranging the memory cells MC shown in FIGS. 2A to 4B to form a matrix composed of N rows each including M memory cells MC arranged in the row direction and M columns each including N memory cells MC arranged in the column direction. In this case, symbols M and N are each a relatively large integer that can be set arbitrarily at a concrete value.

The gate electrodes of the access transistors AT in M memory cells MC arranged in the row direction are connected to each other by a word line WL. Since there are N rows in the memory-cell array 1, N word lines WL<0> to WL<N−1> are used. The N word lines WL<0> to WL<N−1> are laid out at predetermined intervals in the column direction.

In addition, the drain or source electrodes of the access transistors AT in N memory cells MC arranged in the column direction are connected to each other by a bit line BL. Since there are M columns in the memory-cell array 1, M bit lines BL<0> to BL<M−1> are used. The M bit lines BL<0> to BL<M−1> are laid out at predetermined intervals in the row direction.

In the same way, specific ends of the variable-resistance elements Re in N memory cells MC arranged in the column direction are connected to each other by a source line SL. Since there are M columns in the memory-cell array 1, M source lines SL<0> to SL<M−1> are used. The M source lines SL<0> to SL<M−1> are laid out at predetermined intervals in the row direction. The specific end of the variable-resistance element Re employed in every memory cell MC is the end on a side opposite to the access transistor AT employed in the same memory cell MC.

The bit lines BL and the source lines SL are laid out alternately in the row direction.

A bit line BL serving as the first common line connecting the N memory cells MC arranged in the column direction forms a line pair in conjunction to a source line SL placed at a location adjacent to the bit line BL to serve as the second common line connecting the N memory cells MC. In the following description, the line pair formed by a bit line BL and a source line SL adjacent to the bit line BL is also referred to as a common-line pair in some cases.

The peripheral circuit has set/reset drivers 10 and sense amplifiers SA 7. Each set/reset driver 10 drives one of the common-line pairs (BL<i> and SL<i>: i=0 to (M−1)). A sense amplifier SA reads out data from a bit line BL<i>.

A set/reset driver 10 and a SA (sense amplifier) 7 form a column driving circuit. The column driving circuit corresponds to a main section referred to as a driving circuit according to an embodiment of the present disclosure. It is to be noted that the driving circuit according to an embodiment of the present disclosure includes the set/reset driver 10 but does not have to include the SA (sense amplifier) 7.

The peripheral circuit also has a pre-decoder 3, a row driving circuit 4 and a column switch circuit 6.

The pre-decoder 3 is a circuit for splitting an input address signal into a row address of an X system and a column address of a Y system.

The row driving circuit 4 has an X-address main decoder, a Y-address main decoder, a column-switch control circuit and a WL (word line) driver.

The peripheral circuit also has an I/O (input/output) buffer 9, a control circuit 11 and a logic block 16.

The logic block 16 is a logic circuit section of a control system for controlling operations to input and output data, an operation to save data and a buffering operation. If necessary, the logic block 16 can also be configured to carry out control of a write inhibit state for every column of the memory-cell array 1.

It is to be noted that FIG. 5 does not show other circuits such as a circuit for generating a variety of voltages from the voltage of a power supply and a circuit for controlling generation of a clock signal.

The row driving circuit 4 has the function of a main decoder. The row driving circuit 4 is configured to include an X selector 20 and a Y selector 30 in order to carry out this function.

The row driving circuit 4 also has the function of a control circuit of a CSW (column switch). The row driving circuit 4 is configured to include a plurality of YSW driver units 6A in order to carry out this function.

In addition, the row driving circuit 4 also has the function of a WL driver. The row driving circuit 4 is configured to include as many WL driver units 4A as the word lines WL to carry out this function. As described earlier, the number of word lines is N.

Typical concrete circuits of the X selector 20, the Y selector 30, the YSW driver unit 6A and the WL driver unit 4A will be described later.

As explained above, the pre-decoder 3 is a circuit for splitting an input address signal into an X address signal (X0, X1 and so on) and a Y address signal (Y0, Y1 and so on).

The X address signal (X0, X1 and so on) is supplied to the X selector 20 employed in the row driving circuit 4. The X selector 20 decodes the X address signal. As a decoding result, the X selector 20 generates X select signals X_SEL <0> to <N−1> used for selecting a WL driver unit 4A. That is to say, the X select signals X_SEL <0> to <N−1> are supplied to the N WL driver units 4A respectively.

On the other hand, the Y address signal (Y0, Y1 and so on) is supplied to the Y selector 30 employed in the row driving circuit 4. As a decoding result, the Y selector 30 generates a Y select signal YSEL. The number of Y select signals Y_SEL varies in accordance with the configuration of the column switch circuit 6 shown in FIG. 5. Thus, the number of YSW driver units 6A for driving the column switch circuit 6 on the basis of the Y select signal Y_SEL also varies in accordance with the configuration of the column switch circuit 6. Accordingly, the number of signals generated by the YSW driver units 6A also varies in accordance with the configuration of the column switch circuit 6.

When a WL driver unit 4A is selected by an X select signal X_SEL, the WL driver unit 4A applies a voltage determined in advance to a word line WL connected to the output of the WL driver unit 4A. Details of the WL driver unit 4A will be described later.

Next, the configuration of the column switch circuit 6 shown in FIG. 5 is explained as follows. This configuration is different from a detailed circuit to be described later. However, the configuration of the column switch circuit 6 is deliberately shown in FIG. 5 in order to indicate that such a configuration can also be adopted.

As shown in FIG. 5, the column switch circuit 6 has a common-line separation switch section 6B and a discharge switch section 6C.

The common-line separation switch section 6B is a collection of NMOS switches for selecting every other common-line pair (BL<i> and SL<i>: i=0 to (M−1)). Thus, the common-line separation switch section 6B connects selectively either (odd-number)th memory-cell columns or (even-number)th memory-cell columns to the set/reset driver 10.

On the other hand, the discharge switch section 6C carries out an operation opposite to that of the common-line separation switch section 6B.

With the common-line pairs of the (odd-number)th memory-cell columns connected by the common-line separation switch section 6B to the set/reset driver 10, the common-line pairs of the (even-number)th memory-cell columns are connected to the electric potential of the ground by the discharge switch section 6C. With the common-line pairs of the (even-number)th memory-cell columns connected by the common-line separation switch section 6B to the set/reset driver 10, on the other hand, the common-line pairs of the (odd-number)th memory-cell columns are connected to the electric potential of ground by the discharge switch section 6C.

By adopting the configuration described above, one set/reset driver 10 and one SA (sense amplifier) 7 can be provided for every two memory-cell columns. Thus, this configuration is effective for a case in which a large area is required for providing the set/reset driver 10 and the SA (sense amplifier) 7 as an area proportional to the location density of memory cells MC. In particular, this configuration is effective for a case in which the size of such area in the row direction is large.

The set/reset driver 10 is capable of selecting any arbitrary memory cells MC to be driven in collaboration with a section carrying out an operation to select a word line from all memory cells MC included in the memory-cell array 1.

It is to be noted that, for a condition in which the circuit scale of the memory-cell array 1 and the like is small and an area margin and the like exist, the set/reset driver 10 and the SA (sense amplifier) 7 can be provided for every common-line pair.

In such a condition, the set/reset driver 10 is capable of selecting any arbitrary memory cells MC to be driven in collaboration with a section carrying out an operation to select a word line from all memory cells MC included in the memory-cell array 1. From the operation-speed point of view, it is desirable to place the set/reset driver 10 for every common-line pair so as to make any arbitrary access to all memory cells MC possible. With regard to the placing of the set/reset driver 10 for every common-line pair, a detailed typical circuit will be described later.

As many set/reset drivers 10 as the memory columns can be provided or, as an alternative, the number of provided set/reset drivers 10 can be set at half the number of memory columns.

A set gate voltage generation circuit 12 for generating a set gate voltage Vgset and a reset gate voltage generation circuit 13 for generating a reset gate voltage Vgrst are connected to the set/reset drivers 10 the number of which is equal to half the number of memory columns. The set gate voltage Vgset and the reset gate voltage Vgrst are voltages common to the set/ reset drivers 10. The set gate voltage generation circuit 12, the reset gate voltage generation circuit 13 and the set/reset drivers 10 are included in the driving circuit according to an embodiment of the present disclosure.

Typical concrete circuits of the set gate voltage generation circuit 12 and the reset gate voltage generation circuit 13 will be described later.

The control circuit 11 receives a write signal WRT, an erase signal ERS as well as a data read signal RD and, on the basis of the write signal WRT, the erase signal ERS as well as the data read signal RD, the control circuit 11 generates a variety of signals and a variety of voltages. The control circuit 11 has the following four functions.

(1) At a read time, the control circuit 11 generates an SA enable signal SAEN, a clamp voltage Vclamp and a reference electric potential VREF, outputting the SA enable signal SAEN, the clamp voltage Vclamp and the reference electric potential VREF in order to activate and control the SA (sense amplifier) 7.

(2) At a set or reset time, the control circuit 11 controls the set/reset driver 10, the set gate voltage generation circuit 12 and the reset gate voltage generation circuit 13. The control circuit 11 generates control signals for controlling the set/reset driver 10, the set gate voltage generation circuit 12 and the reset gate voltage generation circuit 13. The control signals include an enable signal WEN for enabling a data input operation and a bit-line equalize signal BLEQ. The control circuit 11 supplies the data-input enable signal WEN and the bit-line equalize signal BLEQ to the set/reset driver 10.

(3) At a set or reset time and a read time, the control circuit 11 carries out overall control on the pre-decoder 3, the row driving circuit 4 and the column switch circuit 6.

(4) If necessary, the control circuit 11 controls the set/reset driver 10 and the logic block 16 in order to control data input/output operations and data buffering.

An I/O buffer 9 is connected to the SA (sense amplifier) 7, the set/reset driver 10 and the logic block 16.

The control circuit 11 controls the logic block 16 in order to input data coming from an external source and, if necessary, buffer the data in the I/O buffer 9. The buffered data is later supplied to the set/reset driver 10 with a timing determined in advance to be used for controlling a set or reset operation.

In addition, the control circuit 11 controls the logic block 16 in order to output data read out by the SA (sense amplifier) 7 through the set/reset driver 10 to an external recipient by way of the I/O buffer 9.

Control-System Circuit

Next, the following description explains typical circuits of the X selector 20, the Y selector 30, the WL driver unit 4A and the YSW driver unit 6A.

Figure 6:
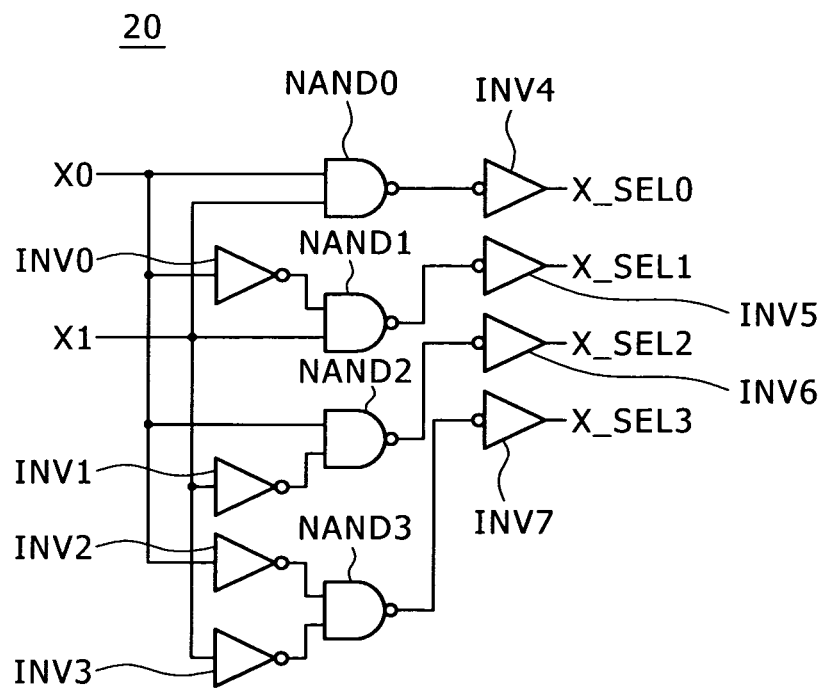
FIG. 6 is a diagram showing a logic circuit of an X selector.

FIG. 6 is a diagram showing a typical logic circuit of the X selector 20.

As shown in FIG. 6, the X selector 20 employs four inverters INV0 to INV3 provided at the front stage, four NAND circuits NAND0 to NAND3 provided at the middle stage and four other inverters INV4 to INV7 provided at the rear stage.

The X selector 20 receives X-address signal bits X0 and X1, decoding the X-address signal bits X0 and X1. As a result of the decoding, the X selector 20 activates one of four X select signals X_SEL0 to X_SEL3 by typically raising one of the four X select signals X_SEL0 to X_SEL3 to a high level.

FIG. 6 shows the configuration of a typical 2-bit decoder. In accordance with the number of X-address signal bits, however, the configuration shown in FIG. 6 can be extended to a multi-bit configuration allowing more bits of the X-address signal to be supplied to the decoder. That is to say, it is possible to adopt a configuration for decoding more than two X-address signal bits.

Figure 7:
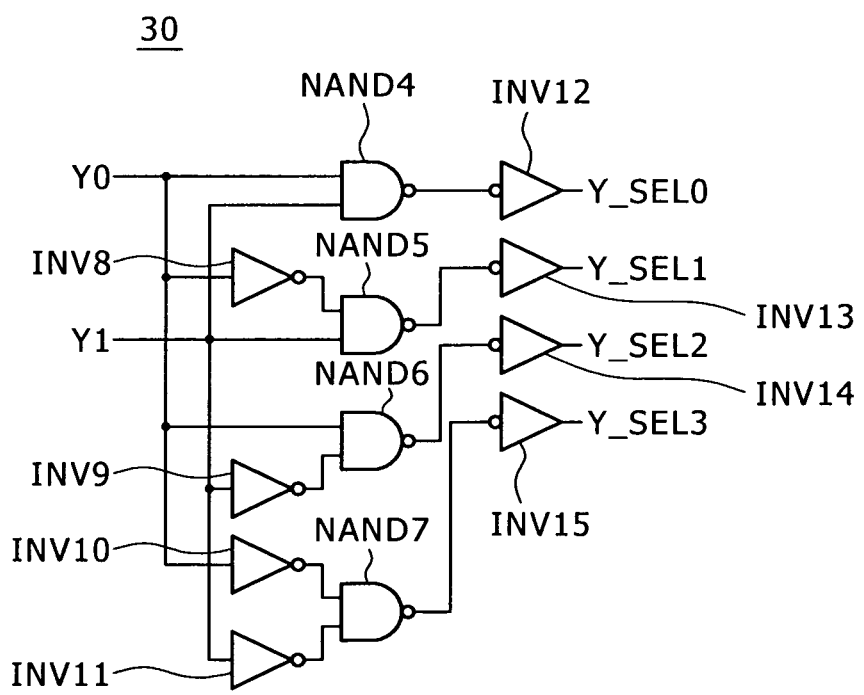
FIG. 7 is a diagram showing a logic circuit of a Y selector.

FIG. 7 is a diagram showing a typical logic circuit of the Y selector 30.

As shown in FIG. 7, the Y selector 30 employs four inverters INV8 to INV11 provided at the front stage, four NAND circuits NAND4 to NAND7 provided at the middle stage and four other inverters INV12 to INV15 provided at the rear stage.

The Y selector 30 receives Y-address signal bits Y0 and Y1, decoding the Y-address signal bits Y0 and Y1. As a result of the decoding, the Y selector 30 activates one of four Y select signals Y_SEL0 to Y_SEL3 by typically raising one of the four Y select signals Y_SEL0 to Y_SEL3 to a high level.

FIG. 7 shows the configuration of a typical 2-bit decoder. In accordance with the number of Y-address signal bits, however, the configuration shown in FIG. 7 can be extended to a multi-bit configuration allowing more bits of the Y-address signal to be supplied to the decoder. That is to say, it is possible to adopt a configuration for decoding more than two Y-address signal bits.

Figure 8:
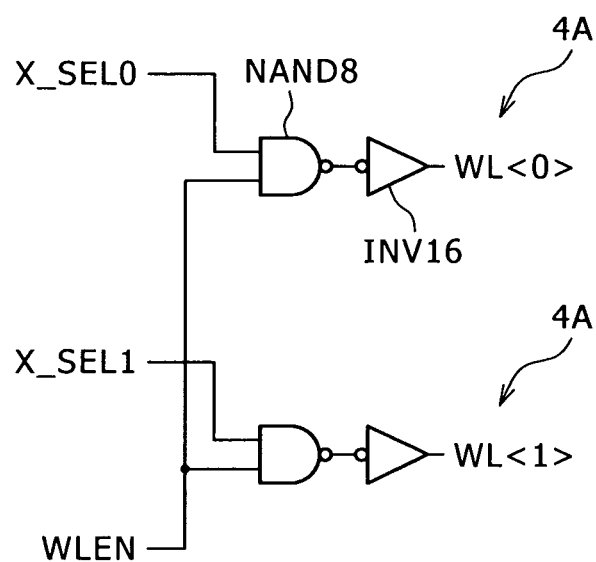
FIG. 8 is a diagram showing a logic circuit of a WL driver unit.

FIG. 8 is a diagram showing a typical logic circuit of two adjacent WL driver units 4A.

The row driving circuit 4 actually includes (N−1) WL driver units 4A two of which are shown in the figure. The number (N−1) is the number of memory cells laid out in the column direction on every column. One of the (N−1) WL driver units 4A is selected to operate by the X select signal X_SEL0 or X_SEL1 activated by the X selector 20 shown in FIG. 6. Then, the selected WL driver unit 4A activates the word line WL<0> or the word line WL<1> corresponding to the X select signal X_SEL0 or the X select signal X_SEL1 respectively.

As shown in FIG. 8, each WL'driver unit 4A employs a NAND circuit (for example, NAND8) and an inverter (for example, INV16).

One of the two inputs of the NAND circuit NAND8 receives a WL select enable signal WLEN whereas the other input receives the X select signal X_SEL0 or X_SEL1 activated by the X selector 20 shown in FIG. 6. The output of the NAND circuit NAND8 is connected to the input of the inverter INV16. Thus, the word line WL<0> or WL<1> connected to the output of the inverter INV16 is activated or deactivated.

Figure 9:
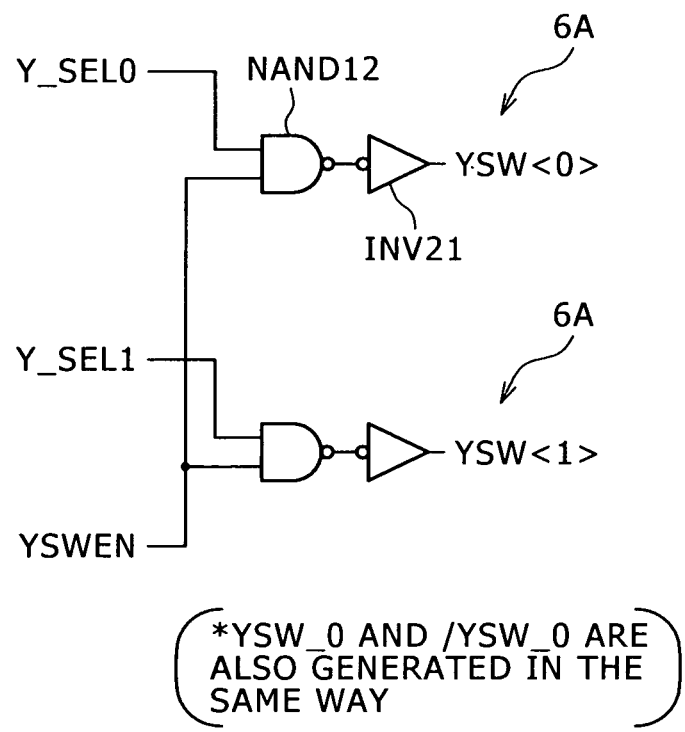
FIG. 9 is a diagram showing a logic circuit of a YSW driver unit.

FIG. 9 is a diagram showing a typical logic circuit of two adjacent YSW driver units 6A.

As shown in FIG. 9, each YSW driver unit 6A employs a NAND circuit (for example, NAND12) and an inverter (for example, INV21).

One of the two inputs of the NAND circuit NAND12 receives a Y switch enable signal YSWEN whereas the other input receives the Y select signal Y_SEL0 or Y_SEL1 activated by the Y selector 30 shown in FIG. 7.

When the Y select signal Y_SEL0 or Y_SEL1 and the Y switch enable signal YSWEN are both set at a high level of an activated state, the signal output by the NAND circuit NAND12 is brought down to a low level. Thus, the column select signal YSW<0> or YSW<1> output by an inverter INV21 connected to the output of the NAND circuit NAND12 makes a transition to an activated level which is the high level in the case of the first embodiment.

The column select signals YSW<0>, YSW<1> and so on which are each referred to hereafter simply as a column select signal YSW are not used in the configuration shown in FIG. 5 but are used in a detailed configuration to be described later as a configuration of the set/reset driver 10.

The YSW driver unit 6A generates a signal pair consisting of the column select signals YSW_0 and /YSW_0 for controlling the column switch circuit 6 as shown in FIG. 5. The YSW driver unit 6A generates the signal pair consisting of column select signals YSW_0 and /YSW_0 by making use of the same logic configuration as that shown in FIG. 9.

Since the column switch circuit 6 operates on the basis of the signal pair consisting of the column select signals YSW_0 and /YSW_0, it is possible to carry out connection control on differences in electric potential between the ground connected to the set/reset driver 10 and the common-line pair (consisting of BL and SL).

Set/Reset Driver

Next, the following description explains a detailed configuration of the set/reset driver 10 having a configuration serving as a characteristic of the present embodiment.

Figure 10:
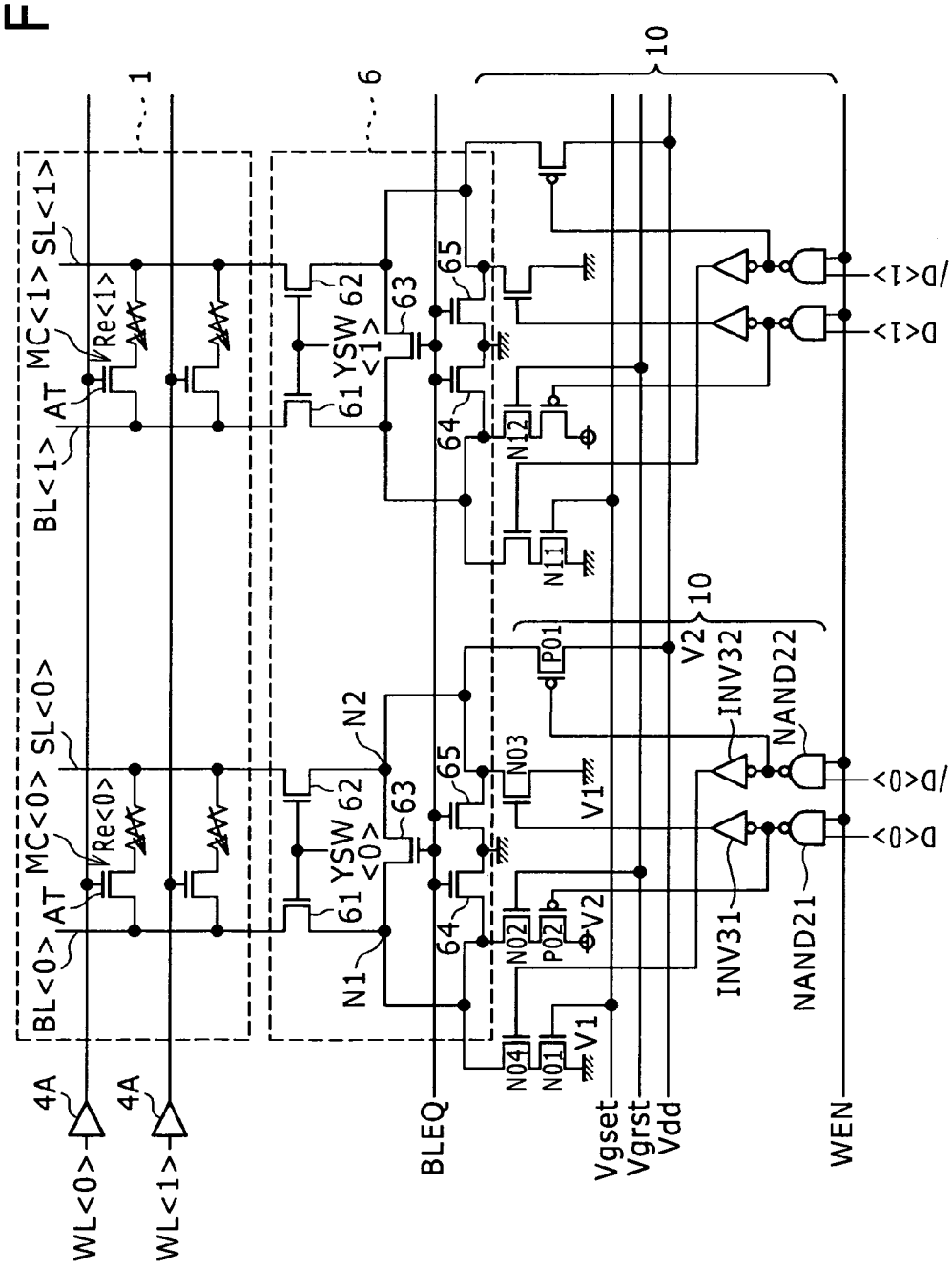
FIG. 10 is a diagram showing circuits including a driving circuit for two memory columns in order to show the configuration of a set/reset driver according to a first embodiment.

FIG. 10 is a diagram showing circuits including a driving circuit for two memory columns in order to show the configuration of the set/reset driver 10 according to a first embodiment. In this case, the memory column is a column of memory cells.

The set/reset driver 10 includes circuit portions except the memory-cell array 1 and the column switch circuit 6. FIG. 10 shows two set/reset drivers 10 which have the same configuration. As will be described later in detail, this circuit portion has a configuration in which, while any arbitrary memory cells in an array of memory cells connected to the same word line WL are being subjected to a set operation, other memory cells can be subjected to a reset operation.

First of all, the configuration of the column switch circuit 6 is explained.

As shown in FIG. 10, the column switch circuit 6 employs five NMOS transistors 61, 62, 63, 64 and 65 for every memory column.

The NMOS transistor 61 serves as a connection/disconnection switch provided for the bit line BL<0> or BL<1> used as the first common line. On the other hand, the NMOS transistor 62 serves as a connection/disconnection switch provided for the source line SL<0> or SL<1> used as the second common line. The gate electrodes of the NMOS transistors 61 and 62 receive the column select signal YSW<0> or YSW<1> generated by the YSW driver unit 6A employed in the variable-resistance memory device shown in FIG. 5. Details of the YSW driver unit 6A are shown in FIG. 9.

This configuration is the configuration of a circuit section that can be replaced by the common-line separation switch section 6B employed in the variable-resistance memory device shown in FIG. 5.

The column switch circuit 6 has the three remaining NMOS transistors 63 to 65 for every memory column. The three remaining NMOS transistors 63 to 65 form a circuit section that can be replaced by the discharge switch section 6C employed in the variable-resistance memory device shown in FIG. 5.

The NMOS transistor 64 is a discharge switch provided for the bit line BL whereas the NMOS transistor 65 is a discharge switch provided for the source line SL. The NMOS transistors 64 and 65 have functions equivalent to those of the transistor group composing the discharge switch section 6C employed in the variable-resistance memory device shown in FIG. 5.

The NMOS transistor 63 is a short-circuit switch provided between the bit line BL<0> and the source line SL<0> or between the bit line BL<1> and the source line SL<1>. This additional NMOS transistor 63 allows the electrical-discharge time to be shortened because electrical-charge equalization is carried out.

The five NMOS transistors 61 to 65 are controlled by a bit-line equalize signal BLEQ common to memory columns. The bit-line equalize signal BLEQ is originated from the control circuit 11 employed in the variable-resistance memory device shown in FIG. 5.

Next, the configuration of the set/reset driver 10 is explained as follows.

The set/reset drivers 10 each provided for one of the memory columns are each configured to include four NMOS transistors, two PMOS transistors, two inverters and two NAND circuits.

Since the set/reset drivers 10 each provided for one of the memory columns have a uniform configuration, the following description explains connections of circuit elements employed in the set/reset driver 10 provided on the left-hand side of FIG. 10.

Voltages and a signal which are supplied to the set/reset driver 10 are a first voltage V1 according to an embodiment of the present disclosure, a second voltage V2 according to an embodiment of the present disclosure, a set gate voltage Vgset, a reset gate voltage Vgrst and a data-input enable signal WEN.

In the first embodiment, first and second path transistors to be described later are each an NMOS transistor. Thus, the first voltage V1 is lower than the second voltage V2. The first voltage V1 and the second voltage V2 can each be set at any arbitrary level as long as the condition requiring that the first voltage V1 be lower than the second voltage V2 and as long as the first voltage V1 and the second voltage V2 are in a range allowing the memory cell to be set and reset. In the case of the typical example shown in FIG. 10, however, the first voltage V1 is set at a reference voltage Vss whereas the second voltage V2 is set at a power-supply voltage Vdd.

Two NMOS, transistors N04 and N01 are connected to each other in series between a node N1 and a node for supplying the reference voltage Vss used as the first voltage V1. The node N1 is a node connected by the NMOS transistor 61 to the bit line BL<0> used as the first common line. The NMOS transistor N04 corresponds to a third control transistor provided by an embodiment of the present disclosure whereas the NMOS transistor N01 corresponds to a first path transistor provided by an embodiment of the present disclosure.

An NMOS transistor N02 and a PMOS transistor P02 are connected to each other in series between the node N1 and a node for supplying the power-supply voltage Vdd used as the second voltage V2. The NMOS transistor N02 corresponds to a second path transistor provided by an embodiment of the present disclosure whereas the PMOS transistor P02 corresponds to a fourth control transistor provided by an embodiment of the present disclosure.

An NMOS transistor N03 is connected between a node N2 and the node for supplying the reference voltage Vss used as the first voltage V1. The node N2 is a node connected by the NMOS transistor 62 to the source line SL<0> used as the second common line. The NMOS transistor N03 corresponds to a second control transistor provided by an embodiment of the present disclosure.

A PMOS transistor P01 is connected between the node N2 and the node for supplying the power-supply voltage Vdd used as the second voltage V2. The PMOS transistor P01 corresponds to a first control transistor provided by an embodiment of the present disclosure.

The inverters INV31 and INV32 as well as the NAND circuits NAND21 and NAND22 form a data input section provided by an embodiment of the present disclosure.

The second input of each of the NAND circuits NAND21 and NAND22 receives the data-input enable signal WEN. The first input of the NAND circuit NAND21 receives data D<0> whereas the first input of the NAND circuit NAND22 receives inverted data /D<0> obtained by inversion of the data D<0>. These pieces of data are obtained from the I/O buffer 9 employed in the variable-resistance memory device shown in FIG. 5.

A signal output by the NAND circuit NAND21 is used for controlling the gate electrode of the PMOS transistor P02 and supplied to the gate electrode of the NMOS transistor N03 by way of the inverter INV31 as a signal for controlling the gate electrode of the NMOS transistor N03. On the other hand, a signal output by the NAND circuit NAND22 is used for controlling the gate electrode of the PMOS transistor P01 and supplied to the gate electrode of the NMOS transistor N04 by way of the inverter INV32 as a signal for controlling the gate electrode of the NMOS transistor N04.

The circuit configuration described above operates as follows. In the 3-line array configuration, at a set operation time, current control is carried out so as to connect the drain output of the NMOS transistor N01 serving as the first path transistor to the bit line BL<0> used as the first common line.

In addition, at a reset operation time, voltage control is carried out so as to connect the source output of the NMOS transistor N02 serving as the second path transistor to the bit line BL<0> used as the first common line.

The set current control is controlled by the set gate voltage Vgset which is a voltage applied to the gate electrode of the NMOS transistor N01. On the other hand, the reset voltage control is controlled by the reset gate voltage Vgrst which is a voltage applied to the gate electrode of the NMOS transistor N02.

In addition, the inverted data /D obtained by inversion of the data D is given to the memory column with arbitrary logic. Thus, while any arbitrary memory cells in an array of memory cells connected to the same word line WL are being subjected to a reset operation, other arbitrary memory cells can be subjected to a set operation.

It is to be noted that these driving circuit operations will be explained later in detail.

Sense Amplifiers

Figure 11:
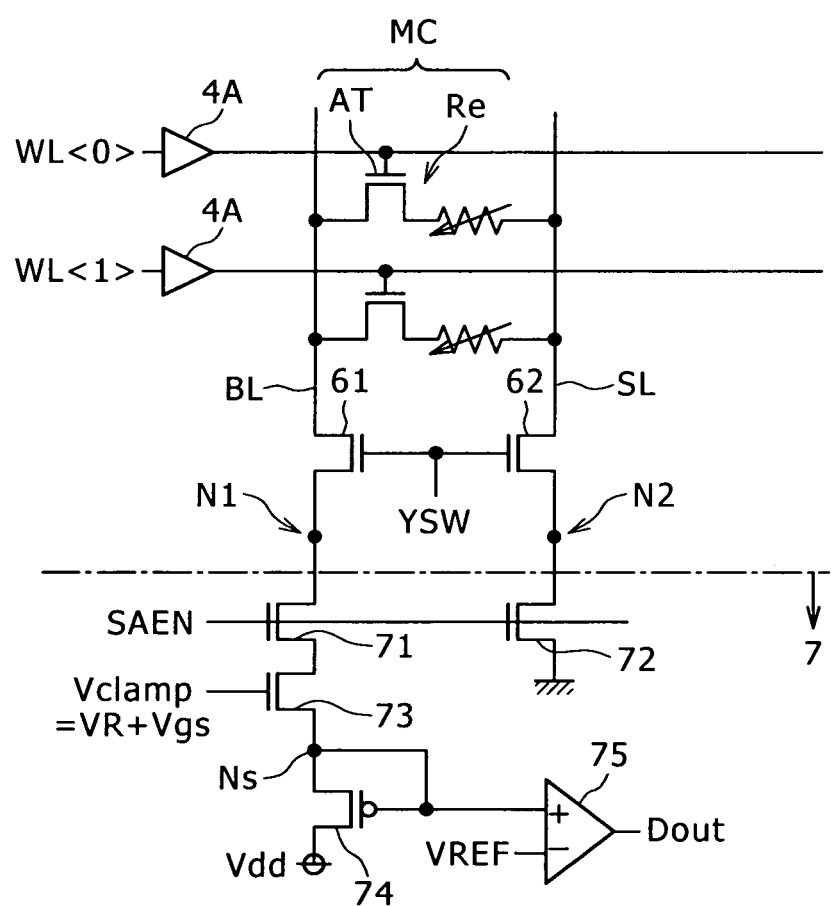
FIG. 11 is a diagram showing circuits including a driving circuit in order to show the configuration of a sense amplifier.

FIG. 11 is a diagram showing the circuit configuration of the SA (sense amplifier) 7 employed in the variable-resistance memory device shown in FIG. 5.

The SA (sense amplifier) 7 shown in FIG. 11 is connected to the nodes N1 and N2 also shown in FIG. 10 in parallel to the set/reset driver 10 shown in FIG. 10. The reader is advised to keep in mind that it is nice to have at least as many sense amplifiers 7 as data bits from which can be read out in parallel in the array of memory cells. That is to say, the sense amplifier 7 is provided not necessarily for every memory column.

As shown in FIG. 11, the SA (sense amplifier) 7 is a single-end sense amplifier configured to employ three NMOS transistors 71, 72 and 73, a PMOS transistor 74 as well as a differential amplifier 75.

The NMOS transistors 71 and 73 as well as the PMOS transistor 74 are connected to form a series circuit between the node N1 and a line for supplying the power-supply voltage Vdd. As described earlier, the connection between the node N1 and the bit line BL is controlled by the NMOS transistor 61. In addition, the NMOS transistor 72 is provided between the node N2 and a line for supplying the reference voltage Vss. As described earlier, the connection between the node N2 and the source line SL is controlled by the NMOS transistor 62.

The NMOS transistors 71 and 72 function as a switch for controlling the connection of the SA (sense amplifier) 7 whereas the NMOS transistor 73 functions as a clamp transistor. On the other hand, the PMOS transistor 74 functions as a load MOS diode.

The source electrode of the PMOS transistor 74 is connected to the line for supplying the power-supply voltage Vdd whereas the gate and drain electrodes of the PMOS transistor 74 are connected to the non-inverting (+) input of the differential amplifier 75. The inverting (−) input of the differential amplifier 75 receives a reference electric potential VREF received from the control circuit 11 employed in the variable-resistance memory device shown in FIG. 5. The gate and drain electrodes of the PMOS transistor 74 as well as the non-inverting (+) input of the differential amplifier 75 are connected to a sense node Ns.

The gate electrodes of the NMOS transistors 71 and 72 receive an SA enable signal SAEN from the control circuit 11 employed in the variable-resistance memory device shown in FIG. 5. On the other hand, the gate electrode of the NMOS transistor 73 receives a clamp voltage Vclamp from the control circuit 11 employed in the variable-resistance memory device shown in FIG. 5.

When the SA enable signal SAEN is set at an L level serving as an inactivated level, the sense node Ns is pulled up by the diode-connected PMOS transistor 74 to an electric potential higher than the reference voltage Vref used as a comparison reference. Thus, a signal Dout output by the differential amplifier 75 is also raised to an H level.

When the SA enable signal SAEN makes a transition to an H level serving as an activated level, the source electrode of the NMOS transistor 73 is connected to the bit line BL. Thus, the NMOS transistor 73 carries out a source follower operation.

The clamp voltage Vclamp is controlled in advance to (VR+Vgs) where reference symbol VR denotes a desired bit-line clamp voltage and reference symbol Vgs denotes a voltage applied between the gate and source electrodes of the NMOS transistor 73. Thus, the bit-line clamp voltage VR is a relatively low voltage. Since the SA enable signal SAEN is also applied at the same time to the sense-amplifier connection control switch on an unselected bit line BL not serving as the subject of a read operation, without this clamp mechanism, the electric potential of the bit line BL increases so that the variable-resistance element Re of an unselected memory cell connected to the unselected bit line BL experiences a read disturbance causing voltage stress. The operation carried out to clamp the electric potential of the bit line BL by making use of the NMOS transistor 73 is thus a solution to this read-disturbance problem.

When the bit-line clamp voltage VR is applied to a memory cell connected to a selected bit line BL, a current flows to the PMOS transistor 74 functioning as a PMOS diode which serves as a load. At that time, the electric potential appearing at the sense node Ns as a voltage of balance between the pull up of the sense node Ns and the BL electric discharging caused the cell current is compared by the differential amplifier 75 with the reference voltage VREF.

If the resistance of the variable-resistance element Re employed in the memory cell is small, the electric potential appearing at the sense node Ns is lower than the reference voltage Vref. Thus, the signal Dout output by the differential amplifier 75 is inverted. A signal Dout not inverted by the differential amplifier 75 indicates that the resistance of the variable-resistance element Re employed in the memory cell is large.

Driving-Circuit Operations (Outline of Set/Reset Operations)

Figure 12:
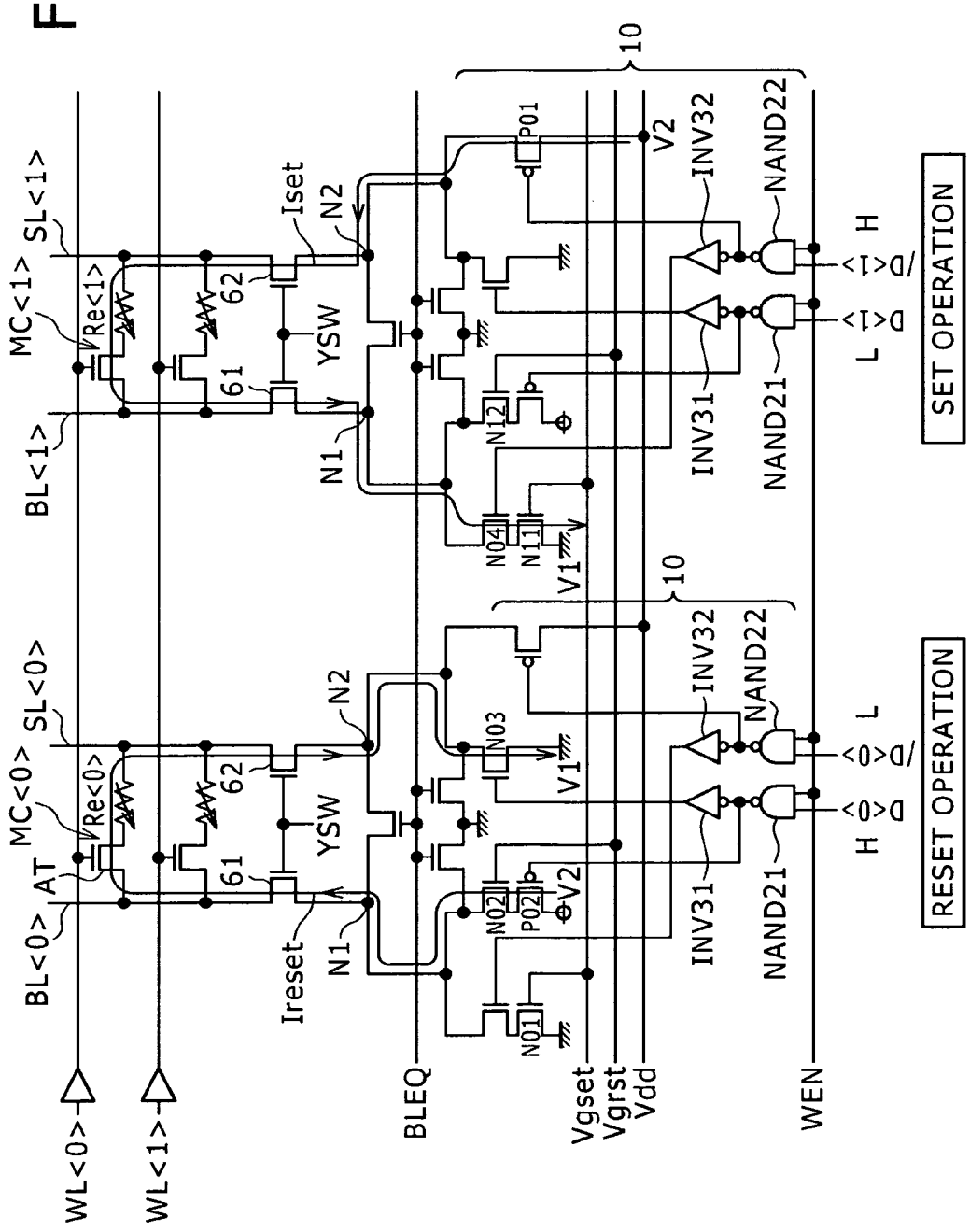
FIG. 12 is a diagram showing circuits including the same driving circuit as that shown in FIG. 10 in order to show a current path.

FIG. 12 is a diagram showing circuits including the same driving circuit as that shown in FIG. 10 in order to show a current path in set and reset operations. FIGS. 13A1 to 13F4 are diagrams showing operation waveforms common to the first and second embodiments.

On the left-hand side, FIG. 12 shows the path of a current flowing when a reset operation is carried out on the variable-resistance element Re<0> employed in a memory cell MC connected to a bit line BL controlled by the NMOS transistors N01 and N02. On the other hand, on the right-hand side, FIG. 12 shows the path of a current flowing when a set operation is carried out on the variable-resistance element Re<1> employed in a memory cell MC connected to a bit line BL controlled by the NMOS transistors N11 and N12.

In FIG. 12, each of the same reference numerals and/or the same reference symbols as those shown in FIG. 10 denote the same configuration and the same connection relation as those shown in FIG. 10 except that, in the set/reset driver 10 shown on the right-hand side of FIG. 12, reference symbol N11 denoting the NMOS transistor N11 used as the first path transistor and reference symbol N12 denoting the NMOS transistor N12 used as the second path transistor are obtained by changing the second digits of reference symbols N01 and N02 shown on the left-hand side from 0 to 1.

Before an operation is carried out, all transistors employed in the set/reset driver 10 are put in a turned-off state. In this state, the nodes N1 and N2 are held at the ground voltage due to an operation carried out by the column switch circuit 6.

In addition, the voltages appearing on the common-line pair consisting of the bit line BL and the source line SL have been equalized to the reference voltage Vss by a bit-line equalize signal BLEQ.

Figure 13:
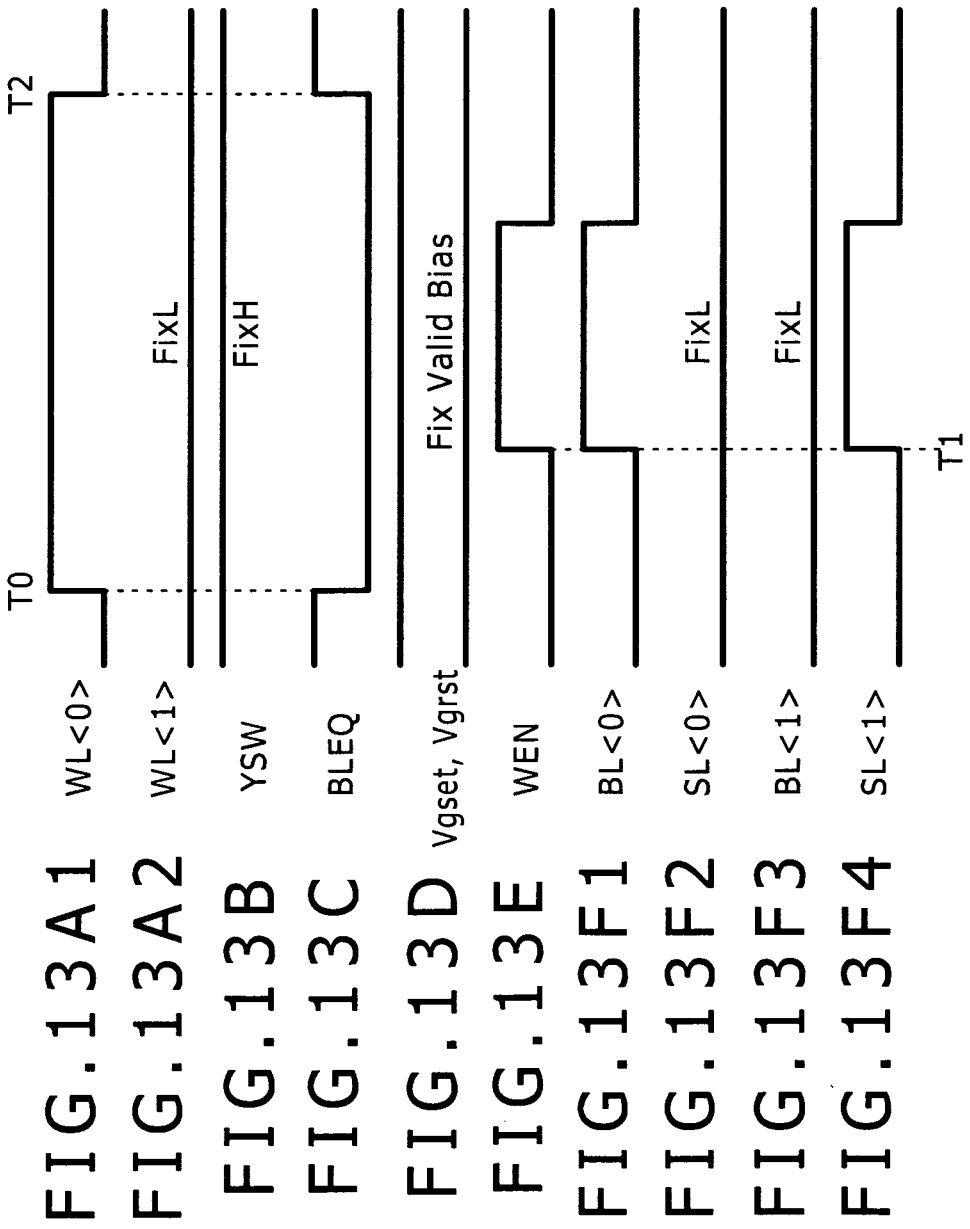

At a time T0, the electric potential of the bit-line equalize signal BLEQ represented by a waveform shown in FIG. 13C falls down, causing the column switch circuit 6 to carry out an electrical discharging operation and discontinue the equalization.

At that time, if the NMOS transistors 61 and 62 are in a turned-on state selecting the memory column, the node N1 is connected to the bit line BL<0> whereas the node N2 is connected to the source line SL<0>.

Figure 1:
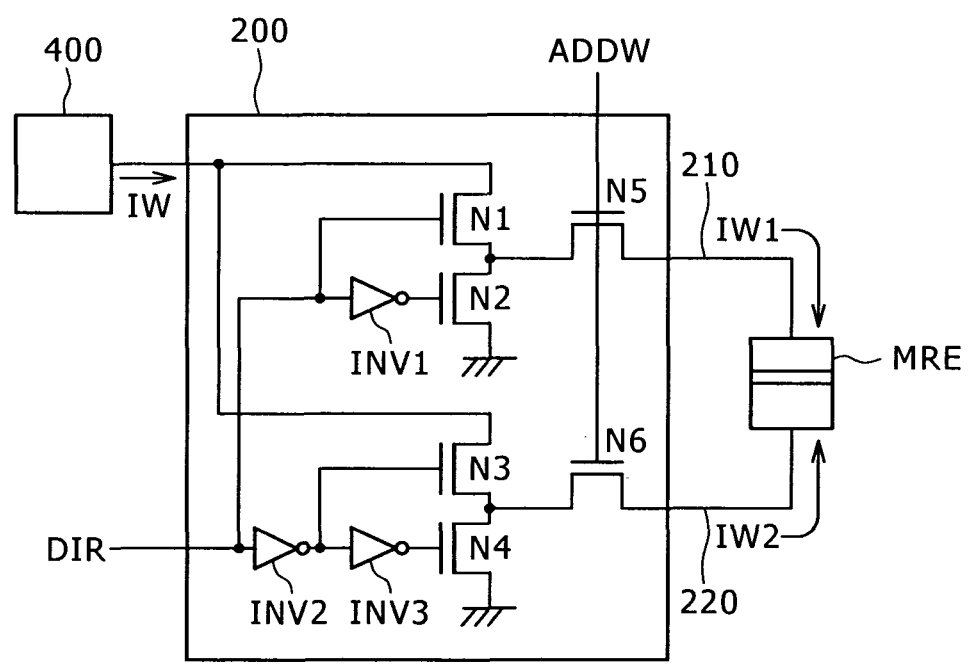
FIG. 1 is a diagram showing the basic configuration of a write line decoder described in a document explaining the related-art technology.

At the time T0, at about the same time as the operation to discontinue the equalization, the electric potential of the word line WL<0> represented by a waveform shown in FIG. 13A1 rises.

In this case, the access transistor AT is no more than a switch. Thus, the access transistor AT put in a turned-on state can be regarded as a low-impedance device in both the set and reset operations.

Therefore, the electric potential of the word line WL rises by typically a voltage amplitude having the same magnitude as the power-supply voltage Vdd. The nodes at which an analog voltage having a magnitude other than the voltage amplitude of the same magnitude as the power-supply voltage Vdd is driven are only a transistor gate electrode to which the set gate voltage Vgset is applied and a transistor gate electrode to which the reset gate voltage Vgrst is applied.

The following description explains data logic, the set gate voltage Vgset and the reset gate voltage Vgrst.

The first input of the NAND circuit NAND21 of the configuration shown in FIG. 12 receives the data D<0> whereas the first input of the NAND circuit NAND22 of the same configuration receives the inverted data /D<0>.

In this case, D<0>=L and /D<0>=H are the data logic of the set operation whereas, conversely, D<0>=H and /D<0>=L are the data logic of the reset operation.

The reset gate voltage Vgrst and the set gate voltage Vgset represented by a waveform shown in FIG. 13D are controlled to allowable voltages proper for their operations respectively.

The reader is advised to refer to FIGS. 13A1 to 13F4. At a time T1 after the electric potential of the word line WL<0> has risen, a pulse of the data-input enable signal WEN represented by a waveform shown in FIG. 13E is applied. With such a pulse applied, in accordance with the logic of the input data, a reset pulse is applied to the variable-resistance element Re<0> of the memory cell MC whereas a set pulse is applied to the variable-resistance element Re<1> of the memory cell MC.

To put it in detail, the data-input enable signal WEN changes from the L level representing the inactivated state to the H level representing the activated state.

With the data-input enable signal WEN changing as described above, in a configuration shown on the right-hand side of FIG. 12 as a configuration receiving the inverted data /D<1> (=H), a signal output by the NAND circuit NAND22 changes from H to L, putting each of the PMOS transistor P01 and the NMOS transistor N04 in a turned-on state. At that time, a signal output by the NAND circuit NAND21 receiving the data D<1> (=L) does not turn on the control transistor.

Thus, in the configuration shown on the right-hand side of FIG. 12, the power-supply voltage Vdd serving as the second voltage is applied to the source line SL<1> represented by a waveform shown in FIG. 13F4 whereas the reference voltage Vss or the ground voltage serving as the first voltage is applied to the bit line BL<1> represented by a waveform shown in FIG. 13F3.

As a result, a set current Iset flows in a direction shown in FIG. 12, carrying out a set operation, on the memory cell MC<1> to typically reduce the resistance of the variable-resistance element Re<1>.

The operation of the configuration shown on the left-hand side of FIG. 12 to serve as a configuration on the reset side is opposite to the operation described above.

To put it in detail, when the data-input enable signal WEN changes from the L level representing the inactivated state to the H level representing the activated state, in the configuration shown on the left-hand side of FIG. 12 as a configuration receiving the inverted data /D<0> (=H), a signal output by the NAND circuit NAND21 changes from H to L, putting each of the PMOS transistor P02 and the NMOS transistor N03 in a turned-on state. At that time, a signal output by the NAND circuit NAND22 receiving the inverted data /D<0> (=L) does not turn on the control transistor.

Thus, in the configuration shown on the left-hand side of FIG. 12, the reference voltage Vss or the ground voltage serving as the first voltage is applied to the source line SL<0> represented by a waveform shown in FIG. 13F2 whereas the power-supply voltage Vdd serving as the second voltage is applied to the bit line BL<0> represented by a waveform shown in FIG. 13F1.

As a result, a reset current Ireset flows in a direction opposite to the direction of the set side, carrying out a reset operation on the memory cell MC<0> to typically increase the resistance of the variable-resistance element Re<0>.

The set or reset time is defined by the pulse width of the data-input enable signal WEN.

Then, at a time T2, the electric potential of the word line WL is lowered and the electric, potential of the bit-line equalize signal BLEQ is raised in order to again connect the common-line pair to the ground and again carry out the equalize operation so as to terminate the operations as indicated by the waveforms shown in FIGS. 13A1 and 13C.

It is to be noted that FIGS. 13A1 to 13F4 shows waveforms for operations carried out under a condition requiring that each of the variable-resistance element Re<0> employed in the memory cell MC<0> and the variable-resistance element Re<1> employed in the memory cell MC<1> be put in a high-resistance state HRS at the initial time.

Thus, the voltage appearing on the bit line BL<1> subjected to the set operation is equal to the reference voltage Vss as is obvious from the waveform shown in FIG. 13F3. The reason for this is explained in the following description making use of a load curve.

This driving control is characterized in that, in a reset operation, the NMOS transistor is driven to carry out a source follower operation in order to control a voltage appearing on the bit line BL whereas, in a set operation, the NMOS transistor is driven to generate a drain output in order to control a current flowing through the bit line BL.

The reader is advised to keep in mind that it is desirable to carry out the set and reset operations synchronously with each other as indicated by the waveforms shown in FIGS. 13A1 to 13F4. However, the set and reset operations can also be carried out asynchronously with each other or in a partially overlapping manner. The driving circuit shown in FIG. 10 is so configured that such operations can be carried out.

Details of the Set Operation

Next, by making use of a load curve, the following description explains a voltage applied to the memory cell MC in current control carried out during a set operation.

Figure 14:
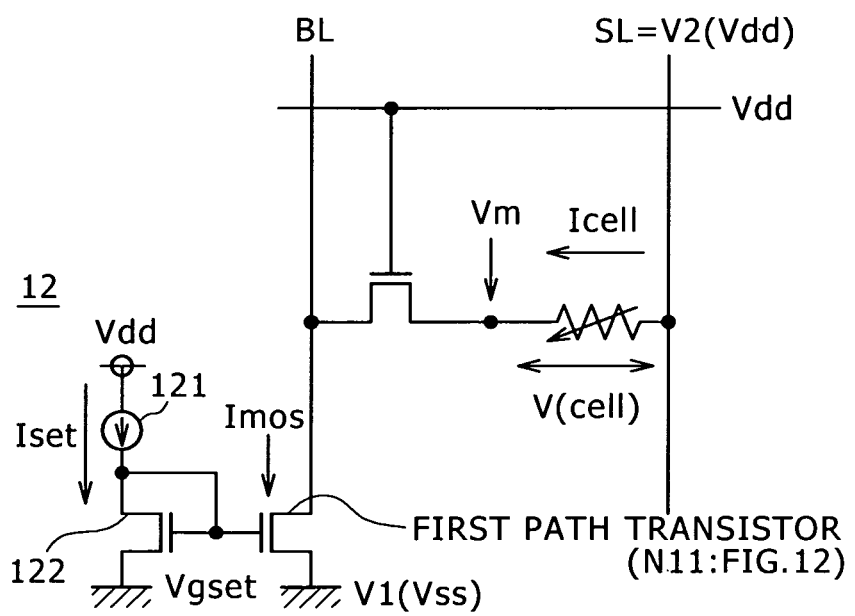
FIG. 14 is a diagram showing an equivalent circuit for a set operation carried out in the first embodiment.

FIG. 14 is a diagram showing an equivalent circuit for a set operation in the first embodiment.

In the set operation, the access transistor AT can be ignored because the access transistor AT is operating at a sufficiently low impedance.

Figure 15A:
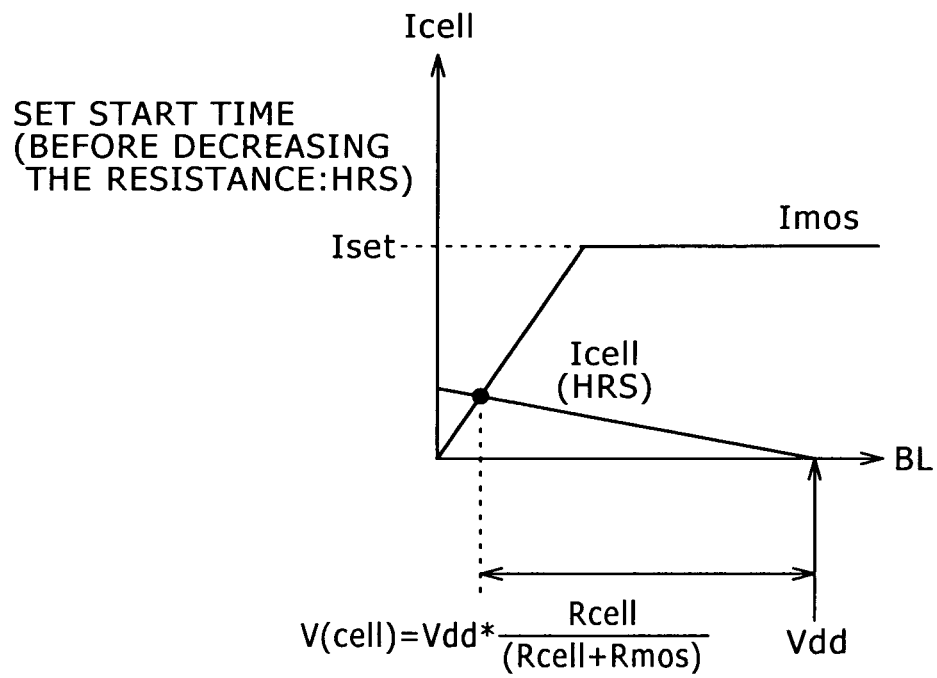
FIGS. 15A and 15B are a plurality of diagrams showing load characteristics right after the start of the set operation and the end of the operation in the first embodiment.

FIG. 15A is a diagram showing characteristics exhibited right after the start of the set operation when the memory cell MC is still in a high-resistance state HRS. To be more specific, the figure shows a characteristic curve of a current Imos flowing through the NMOS transistor and a load straight line of a cell current Icell.

Since the memory cell MC is still in a high-resistance state HRS, the current control path transistor carries out a linear area operation, no longer functioning as a current mirror.

At that time, a voltage V (cell) determined by a ratio expressed by an equation given below is applied to the memory cell MC. As is obvious from the following equation, the ratio is expressed in terms of Rmos and Rcell where reference symbol Rmos denotes the linear resistance of the path transistor and reference symbol Rcell denotes the resistance of the memory cell MC.

$$V(cell)=Vdd \times Rcell/(Rcell+Rmos)$$

A strong voltage stress expressed by the above equation is applied to the memory cell MC. A state of applying the voltage stress to the memory cell MC is a state of applying a trigger voltage required for inversion to a low-resistance state LRS to the memory cell MC in a transient manner right after the start of the set operation. Since the operation to apply a transient stress to the memory cell MC is carried out normally in an operation carried out on the variable-resistance element to change the state of the variable-resistance element within the scope of an assumption, the characteristic of the variable-resistance element by no means deteriorates due to the application of the transient stress.

Figure 15B:
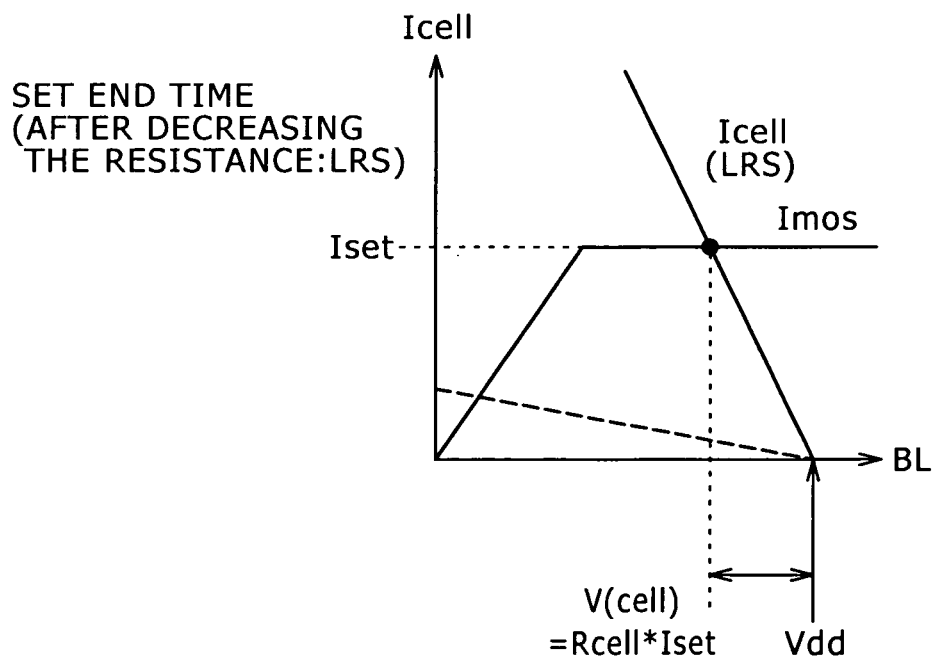

FIG. 15B is a diagram showing characteristics for a state in which the memory element has been inverted to a low-resistance state LRS after the end of the set operation.

After the end of the set operation, the memory cell MC is in a low-resistance state LRS. At that time, in accordance with the saturation characteristic of a curve representing a current flowing through the drain electrode of the NMOS transistor, a current limiter works to limit the current flowing to the memory cell MC to the set current Iset. At that time, the voltage applied to the memory cell MC is limited to the product of (Iset×Rcell) where reference symbol Rcell denotes the resistance of the memory cell MC.

The operations described above are explained in an organized manner as follows.

Prior to the start of the set operation, the common-line pair (consisting of BL and SL) is in a state of being electrically discharged to a reference voltage such as the ground voltage. Thus, no voltage stress is applied to the memory cell MC put in a high-resistance state HRS.

After the state of being connected to the ground is terminated, that is, after the falling edge of the BLEQ pulse represented by the waveform shown in FIG. 13C, the WEN pulse represented by the waveform shown in FIG. 13E rises to start the set operation.

In a very short period after the start of the set operation, the operating point exists in an NMOS linear area as shown in FIG. 15A. Thus, a large voltage stress may be applied to the memory cell MC in some cases.

Since the application period of this voltage stress is a very short transition period, however, there is neither trouble with the characteristic of the memory cell MC nor deterioration of the reliability.

Right after that, the resistance of the memory cell MC is inverted from the high-resistance state HRS to the low-resistance state LRS.

During this state inversion operation, the operating point moves to a saturation area along the curve representing the saturation characteristic of the drain of the NMOS transistor, limiting the flowing current. The current flowing after the state inversion from the high-resistance state HRS to the low-resistance state LRS is the set current Iset. Thus, a relatively small voltage expressed by the product of (Rcell×Iset) is applied between the two ends of the variable-resistance element Re as shown in FIG. 15B. With such a small voltage, however, no voltage stress is developed. Thus, also after the inversion to the set operation, the sustainment of the reliability of the variable-resistance element Re employed in the memory cell MC is assured.

Details of the Reset Operation

Next, by making use of load curves, the following description explains a voltage applied to the memory cell MC subjected to voltage control in a reset operation.

Figure 16:
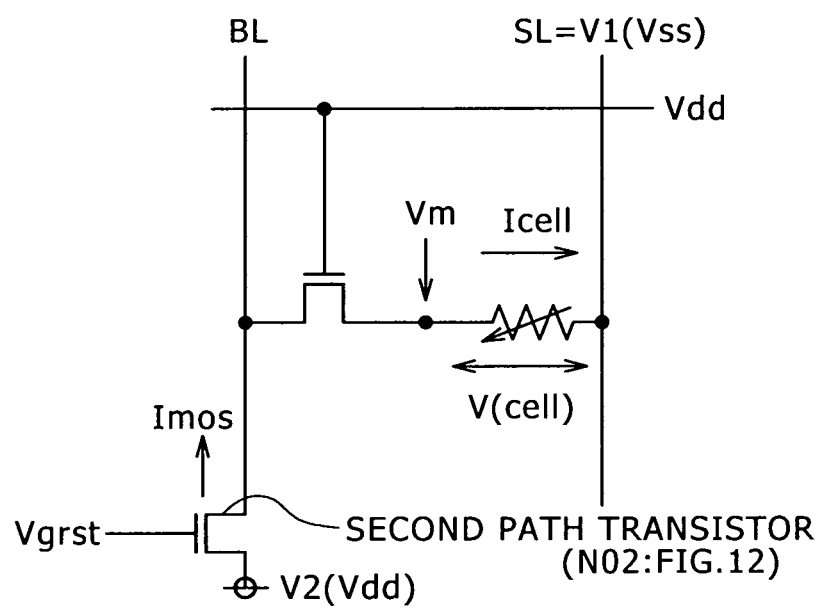
FIG. 16 is a diagram showing an equivalent circuit for a reset operation carried out in the first embodiment.

FIG. 16 is a diagram showing an equivalent circuit for a reset operation in the first embodiment.

At that time, the access transistor AT is operating at a sufficiently low impedance. Thus, it is assumed that a voltage drop along the access transistor AT can be ignored.

Figure 17A:
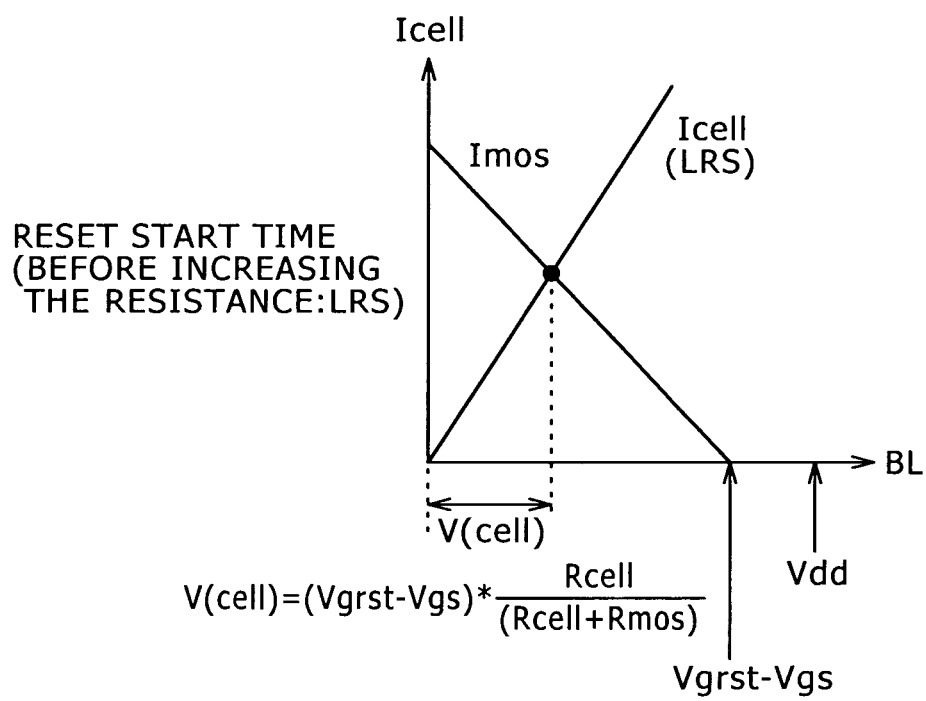
FIGS. 17A and 17B are a plurality of diagrams showing load characteristics right after the start of the reset operation and the end of the operation in the first embodiment.

FIG. 17A is a diagram showing a load characteristic exhibited right after the start of the reset operation when the memory cell MC is still in a low-resistance state LRS. In this figure, the NMOS transistor side is regarded as a load. To be more specific, the figure shows a characteristic curve of a current Imos flowing through the NMOS transistor and a load straight line of a cell current Icell.

Since the NMOS transistor serving as the second path transistor carries out a source-follower operation, the load straight line of the cell current Icell shows that the cell current Icell increases with the source-gate voltage Vgs.

That is to say, a voltage V(cell) determined by a ratio expressed by an equation given below is applied to the memory cell MC. As is obvious from the following equation, the ratio is expressed in terms of Rmos and Rcell where reference symbol Rmos denotes the linear resistance of the first path transistor and reference symbol Rcell denotes the resistance of the memory cell MC.

$$V(\text{cell}) = (Vgrst - Vgs) \times Rcell / (Rcell + Rmos)$$

A large current is applied to the memory cell MC as a current stress. A state of applying the current stress to the memory cell MC is a state of applying a trigger current required for inversion into a high-resistance state HRS to the memory cell MC in a transient manner. Since the operation to apply a transient stress to the memory cell MC is carried out normally in an operation carried out on the variable-resistance element to change the state of the variable-resistance element within the scope of an assumption, the characteristic of the variable-resistance element Re by no means deteriorates due to the application of the transient stress.

Figure 17B:
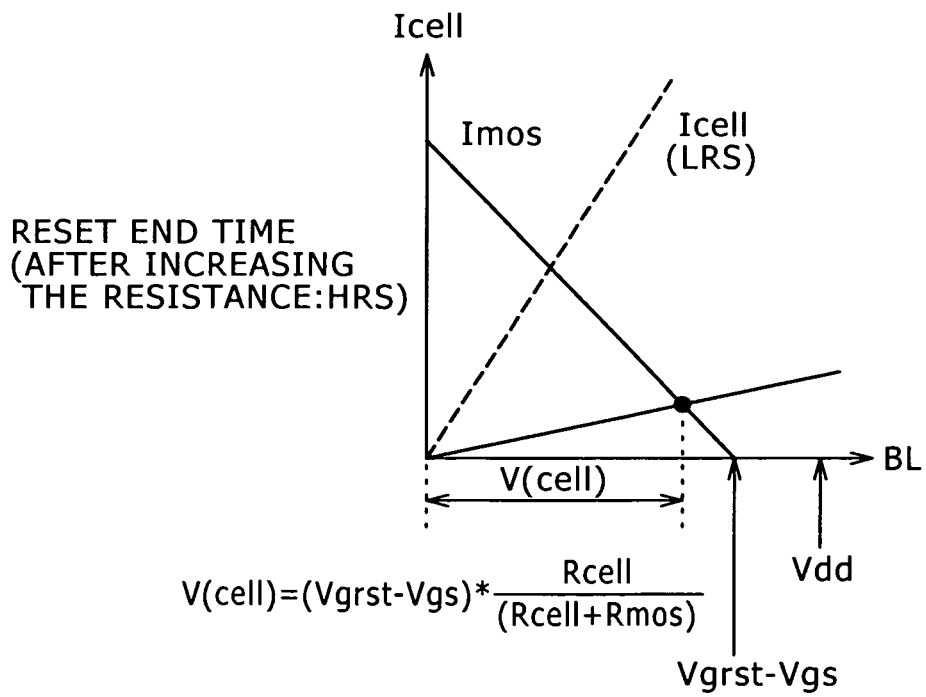

FIG. 17B is a diagram showing load curves for a state in which the memory element has been inverted to a high-resistance state HRS after the end of the reset operation.

After the end of the reset operation, the memory cell MC is in a high-resistance state HRS. At that time, the second path transistor operates as a voltage limiter limiting the increase of the electric potential appearing at the source electrode. As a result, the voltage V (cell) applied to the memory cell MC is expressed by an equation shown in FIG. 17B or the same equation as that shown in FIG. 17A. The magnitude of the voltage V (cell) is not greater than an upper limit expressed by the expression (Vgrst−Vgs) where reference symbol Vgrst denotes the reset gate voltage and reference symbol Vgs denotes a voltage appearing between the gate and source electrodes.

Normally, the reset gate voltage Vgrst is a fraction of the power-supply voltage Vdd. In addition, even if a voltage stress corresponding to the expression (Vgrst−Vgs) is applied to the memory cell MC, there is no trouble with the reliability of the operation of the variable-resistance element Re.

It is to be noted that the magnitude of the reset gate voltage Vgrst applied to the gate electrode of the second path transistor of the circuit shown in FIG. 16 and the magnitude of the current Imos flowing to the first path transistor of the circuit shown in FIG. 14 can be changed. Thus, the magnitudes of the reset gate voltage Vgrst and the current Imos can each be adjusted to an optimum value in accordance with the state of the variable-resistance element Re and other requirements.

The operations described above are explained in an organized manner as follows.

Prior to the start of the reset operation, the common-line pair (consisting of BL and SL) is in a state of being electrically discharged to a reference voltage such as the ground voltage. Thus, no voltage stress is applied to the memory cell MC put in a low-resistance state LRS.

After the state of being connected to the ground is terminated, that is, after the falling edge of the BLEQ pulse represented by the waveform shown in FIG. 13C, the WEN pulse represented by the waveform shown in FIG. 13E rises to start the reset operation.

In a very short period after the start of the reset operation, the operating point exists on a side of low electric potentials of the bit line BL as shown in FIG. 17A. Thus, a large current stress may be applied to the memory cell MC in some cases.

Since the application period of this current stress is a very short transition period, however, there is neither trouble with the characteristic of the memory cell MC nor deterioration of the reliability. In addition, this current stress is a trigger required in operation to invert the resistance of the memory cell MC is inverted from the low-resistance state LRS to the high-resistance state HRS. Thus, this current stress is a stress within the scope of an assumption for the variable-resistance element Re subjected to current driving.

Right after that, the state of the resistance of the memory cell MC is inverted from the high-resistance state HRS to the low-resistance state LRS.

During this state inversion operation, the operating point moves to a side of high electric potentials of the bit line BL. However, the upper limit of the high electric potentials of the bit line BL can be controlled by a voltage applied to the gate electrode of the second path transistor. On top of that, the upper limit of the high electric potentials of the bit line BL can be set at a value sufficiently smaller than the power-supply voltage Vdd. This voltage application does not give rise to a voltage stress causing the reliability of the variable-resistance element Re to be lost. Thus, also after the inversion to the reset operation, the sustainment of the reliability of the variable-resistance element Re employed in the memory cell MC is assured.

It is to be noted that FIG. 14 shows a typical example of the set gate voltage generation circuit 12 shown in FIG. 5 as a circuit for adjusting the reset gate voltage Vgrst in order to set the current Imos at a desired magnitude.

As shown in FIG. 14, in the set gate voltage generation circuit 12, a constant current source 121 and an NMOS transistor 122 are connected to each other in series between a line for supplying the power-supply voltage Vdd and a line for supplying the voltage of the ground. The constant current source 121 supplies a current to the drain electrode of the NMOS transistor 122 having its gate electrode connected to the drain electrode. The gate electrode of the NMOS transistor 122 is also connected to the gate electrode of a first path transistor.

With the configuration described above, if a set current Iset is set in the constant current source 121, the current Imos flowing through the memory cell MC as a mirror current after reduction of the variable resistance can be set at the set current Iset. Thus, by adjusting the set current of the constant current source 121, the current flowing through the memory cell MC and the voltage applied to the memory cell MC can be adjusted.

Even though this circuit is required to have a driving capability which is high to a certain degree, this circuit has a simple configuration. It is thus easy to implement this circuit inside an IC. In addition, one circuit is sufficient for the array of memory cells MC. Thus, this circuit is by no means a cause undesirably limiting the density of arrangement of memory cells MC.

On the other hand, the configuration of every column of the set/reset driver 10 employed in the variable-resistance memory device shown in FIG. 10 and other figures is also by no means a cause undesirably limiting the density of arrangement of memory cells MC.

The reader is advised to keep in mind that it is possible to provide a configuration in which the set/reset driver 10 is shared by two memory columns oriented in the column direction and placed at locations adjacent to each other in the row direction.

Typical Comparison Circuit

Next, a typical comparison circuit is explained.

The current switching operation of the related-art technology explained by referring to FIG. 1 is carried out in a configuration in which, for both the set and reset operations, a current flowing from the drain electrode of an NMOS transistor to the source electrode of the transistor is directed to the memory cell MC.

Because this operation is rate-limited by the characteristic of saturation of a current flowing through the drain electrode of the transistor, this operation is regarded as an operation equivalent to the drain output operation according to the first embodiment as explained before by referring to FIGS. 14 to 16.

Thus, the following description explains a case in which a typical comparison circuit carries out a reset operation by outputting a current from the drain electrode of a transistor. Then, the following description explains disadvantages of the typical comparison circuit. The nonexistence of the disadvantages is an effect for the related-art technology serving as a background technology of the present disclosure.

Figure 18:
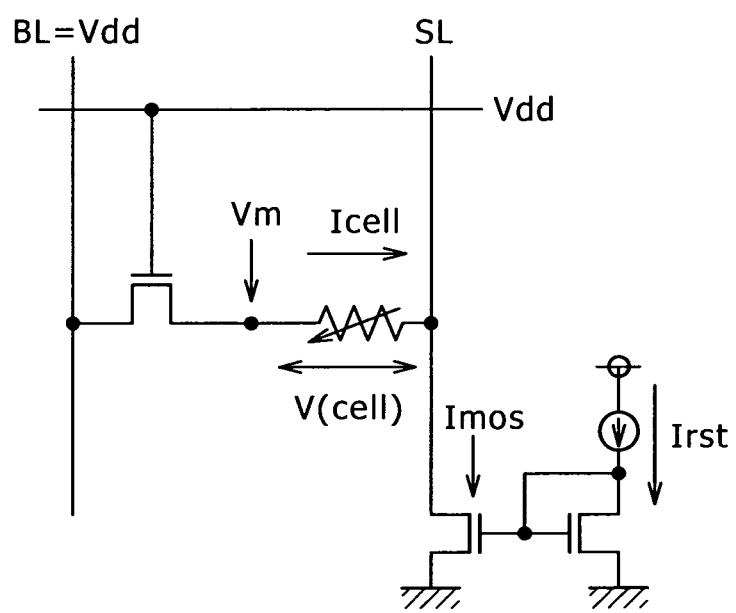
FIG. 18 is a diagram showing an equivalent circuit for a reset operation in a typical comparison circuit.

FIG. 18 is a diagram showing an equivalent circuit for a reset operation in a typical comparison circuit. The reset operation is carried out from the SL (source line) side by making use of a circuit having a configuration identical with the set gate voltage generation circuit 12 as an operation for a memory cell MC completing a set operation explained earlier by referring to the equivalent circuit shown in FIG. 14.

In FIG. 18, reference symbol Vm denotes a middle node in the 1T1R memory cell MC whereas reference symbol V (cell) denotes an electric-potential difference applied to the memory cell MC.

By handling the reset current Irst as a current mirror, flowing currents are controlled. At that time, the current flowing through the memory cell MC is the memory-cell current Icell whereas the current flowing through the PMOS path transistor controlled by the current mirror is the current Imos.

Since the operation is a reset operation, the initial state is a low-resistance state LRS whereas the operating point is a point at which the equation Icell=Imos holds true.

Figure 19A:
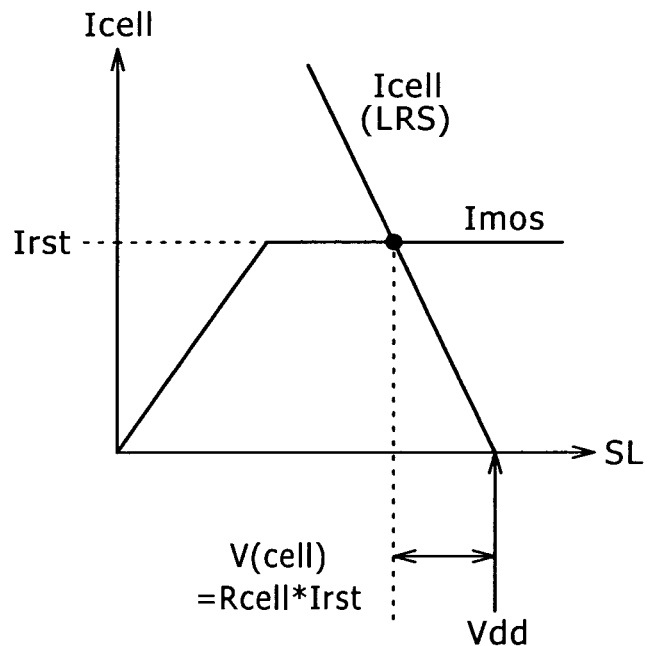
FIGS. 19A and 19B are a plurality of diagrams showing load characteristics showing in high-resistance and low-resistance states of a memory element in the typical comparison circuit.

FIG. 19A is a diagram showing a load characteristic for a case in which the SL electric potential is swept in a low-resistance state LRS. At that time, the access transistor AT is operating at a sufficiently low impedance. Thus, it is assumed that a voltage drop along the access transistor AT can be ignored.

Even though the memory cell MC is in a low-resistance state LRS, the reset current Irst is controlled by a current limiter so that a voltage applied to the memory cell MC is limited to the product of (Irst×Rcell) where reference symbol Rcell denotes the resistance of the memory cell MC.

Figure 19B:
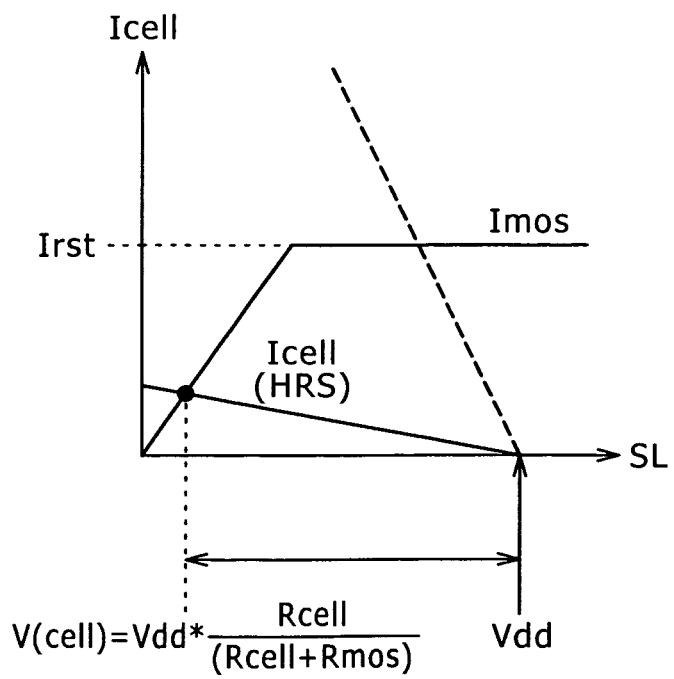

FIG. 19B is a diagram showing a load characteristic for a case in which the SL electric potential is swept after the operation to invert the state from a low-resistance state LRS to a high-resistance state HRS. At that time, the access transistor AT is operating at a sufficiently low impedance. Thus, it is assumed that a voltage drop along the access transistor AT can be ignored.

Since the memory cell MC is in a high-resistance state HRS, the path transistor provided for current control is operating in a linear area so that the current mirror does not function anymore.

As a result, a voltage V (cell) having a magnitude determined by an equation shown in FIG. 19B is applied to the memory cell MC. As shown by the equation, the voltage V (cell) is proportional to a ratio expressed in terms of the linear resistance Rmos of the path transistor and the resistance Rcell of the memory cell MC. The voltage V (cell) is approximately equal to the difference of (Vdd−Vgs).

The difference of (Vdd−Vgs) may give rise to an excessively large voltage stress applied to the memory cell MC in some cases.

On top of that, in a circuit having a configuration like the one shown in FIG. 1, the period during which the voltage stress is applied to the memory cell MC is long in some cases.

In the configuration shown in the figure, a current generated by the same current generation circuit to flow to a common-line pair is simply switched from one of the common lines of a common-line pair to the other common line of the common-line pair and vice versa.

When a reset operation is carried out with an extremely early timing as a result of application of a certain reset pulse, during a long period between the start of the execution of the reset operation and the end of the reset pulse, a strong voltage stress is undesirably applied to the memory cell MC. As a result of repeated execution of such a reset pulse, it is feared that the characteristic of the memory cell MC undesirably deteriorates much.

The driving circuit and the driving method which are provided by an embodiment of the present disclosure are particularly effective for a memory device employing a variable-resistance element having a large width of a resistance change as is the case with the ReRAM in which the resistance of a variable-resistance element changes by a plurality of digits.

In addition, in comparison with a driving circuit for controlling the set and reset operations by changing the direction of a current generated by the same current generation circuit as shown in FIG. 1, the first embodiment has a big advantage that the characteristic of the memory cell MC hardly deteriorates.

2: Second Embodiment

Figure 20:
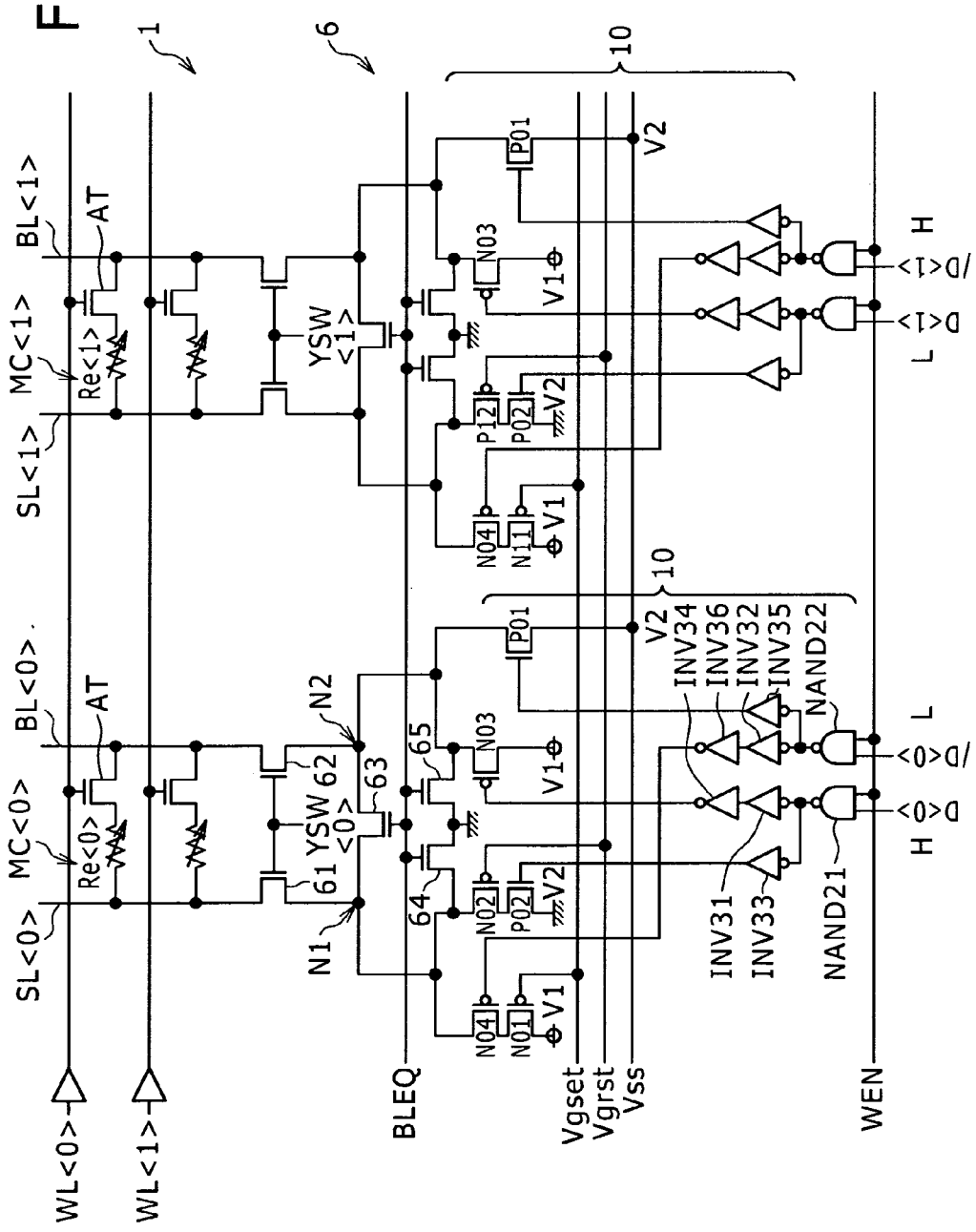
FIG. 20 is a diagram showing circuits including a driving circuit for two memory columns in order to show the configuration of a set/reset driver according to a second embodiment.

FIG. 20 is a diagram showing circuits according to a second embodiment as circuits corresponding to those implemented by the first embodiment as shown in FIG. 10. In FIG. 20, circuit elements identical with their respective counterparts employed in the first embodiment shown in FIG. 10 are denoted by the same reference numerals and the same reference symbols as the counterparts.

However, a circuit element denoted by the same reference numeral or the same reference symbol as the counterpart may have a configuration different from that of the counterpart due to some components employed in the circuit element. To put it concretely, for example, the set/reset driver 10 of the second embodiment also employs first and second path transistors as well as first to fourth control transistors. These first and second path transistors as well as these first to fourth control transistors are deliberately denoted by the same reference numerals as their respective counterparts employed in the first embodiment shown in FIG. 10 in order to make it easy to refer to the transistors. However, the channel conduction type of every transistor employed in the second embodiment is opposite to the channel conduction type of the counterpart employed in the first embodiment. For example, a transistor employed in the set/reset driver 10 of the second embodiment shown in FIG. 20 is denoted by the same reference numeral as its counterpart employed in the set/reset driver 10 of the first embodiment shown in FIG. 10 but the transistor is a PMOS transistor whereas the counterpart is an NMOS transistor. Conversely, a transistor employed in the set/reset driver 10 of the second embodiment shown in FIG. 20 is denoted by the same reference numeral as its counterpart employed in the set/reset driver 10 of the first embodiment shown in FIG. 10 but the transistor is an NMOS transistor whereas the counterpart is a PMOS transistor.

In addition, in the second embodiment shown in FIG. 20, the first common line connected to the first path PMOS transistor N01 and the second path PMOS transistor N02 is the source line SL which is different from the first embodiment shown in FIG. 10. However, the source line SL or the bit line BL can be selected arbitrarily as the first (or second) common line.

In general, the common line connected to the read circuit is referred to as the bit line BL. Thus, in comparison with the source line SL, changes of the voltage appearing on the bit line BL are large and the number of such voltage changes is also large as well. Thus, in order to protect the variable-resistance element Re from such voltage changes, the access transistor AT put in a turned-off state when not selected is provided on the bit-line side. If an effect of variations of the electric potential appearing on such a common line is not taken into consideration, however, in the same way as the first embodiment, also in the case of the second embodiment, the bit line can be used as the first common line.

In addition, the definitions of the first and second voltages are opposite to the definitions in the first embodiment.

To put it concretely, in the case of the second embodiment, the first voltage is the high-level voltage such as the power-supply voltage Vdd whereas the second voltage is the low-level voltage such as the reference voltage Vss.

Waveforms for operations carried out in the second embodiment are the same as those shown in FIGS. 13A1 to 13F4. That is to say, the waveforms are waveforms for a reset operation carried out on the variable-resistance element Re<0> employed in the memory cell MC<0> and a set operation carried out on the variable-resistance element Re<1> employed in the memory cell MC<1>.

Figure 21:
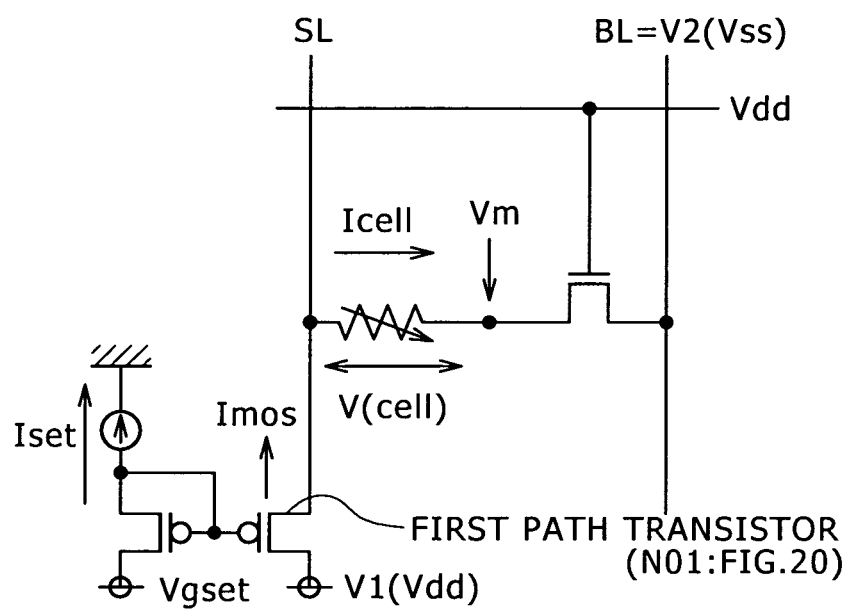
FIG. 21 is a diagram showing an equivalent circuit for a set operation carried out in the second embodiment.

FIG. 21 is a diagram showing an equivalent circuit for a set operation in the second embodiment.

In the equivalent circuit shown in FIG. 21, the first path transistor denoted by reference symbol N01 in FIG. 20 is a PMOS transistor obtained by changing the NMOS transistor employed in the equivalent circuit shown in FIG. 14. In addition, the first voltage V1 is the power-supply voltage Vdd which is a voltage set at a high level. On top of that, the configuration of the set gate voltage generation circuit 12 shown in FIG. 21 is different from the configuration of the set gate voltage generation circuit 12 shown in FIG. 14.

Since the set gate voltage generation circuit 12 shown in FIG. 21 is a circuit driving a current to flow into the memory cell MC, the posture of the MOS-transistor drain saturation characteristic curve with respect to the increasing direction of the electric potential of the common line which is the source line SL is opposite to the posture of the MOS-transistor drain saturation characteristic curve with respect the electric potential of the common line which is the bit line BL in the case of the set gate voltage generation circuit 12 shown in FIG. 14. By the same token, the posture of the load straight line with respect to the increasing direction of the electric potential of the common line which is the source line SL in the case of the set gate voltage generation circuit 12 shown in FIG. 21 is opposite to the posture of the load straight line with respect the electric potential of the common line which is the bit line BL in the case of the set gate voltage generation circuit 12 shown in FIG. 14.

At that time, the access transistor AT is operating at a sufficiently low impedance. Thus, it is assumed that a voltage drop along the access transistor AT can be ignored.

Figure 22A:
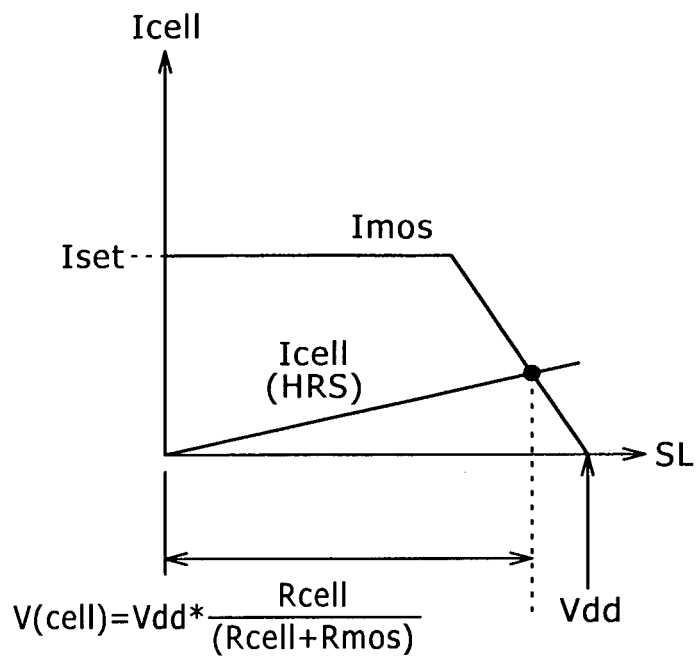
FIGS. 22A and 22B are a plurality of diagrams showing load characteristics right after the start of the set operation and the end of the operation in the second embodiment.

FIG. 22A is a diagram showing characteristics exhibited right after the start of the set operation when the memory cell MC is still in a high-resistance state HRS. To be more specific, the figure shows a characteristic curve of a current Imos flowing through the NMOS transistor and a load straight line of a cell current Icell.

FIG. 22A is compared with FIG. 15A, which is provided for the first embodiment, as follows. Replacing the bit line BL, the source line SL is used as the first common line connected to the path transistor. In addition, accompanying the change to a driving method of letting a current flow to the memory cell MC, as described above, the posture of the MOS-transistor drain saturation characteristic curve with respect to the increasing direction of the electric potential of the common line which is the source line SL in the case of the set gate voltage generation circuit 12 shown in FIG. 21 is opposite to the posture of the MOS-transistor drain saturation characteristic curve with respect the electric potential of the common line which is the bit line BL in the case of the set gate voltage generation circuit 12 shown in FIG. 14. By the same token, the posture of the load straight line with respect to the increasing direction of the electric potential of the common line which is the source line SL in the case of the set gate voltage generation circuit 12 shown in FIG. 21 is opposite to the posture of the load straight line with respect the electric potential of the common line which is the bit line BL in the case of the set gate voltage generation circuit 12 shown in FIG. 14.

However, even though the operating point is positioned in the linear area of the MOS transistor so that a large voltage stress is applied to the variable-resistance element Re, a transient voltage is applied during a short state-transition time in the same way as the first embodiment explained before.

Figure 22B:
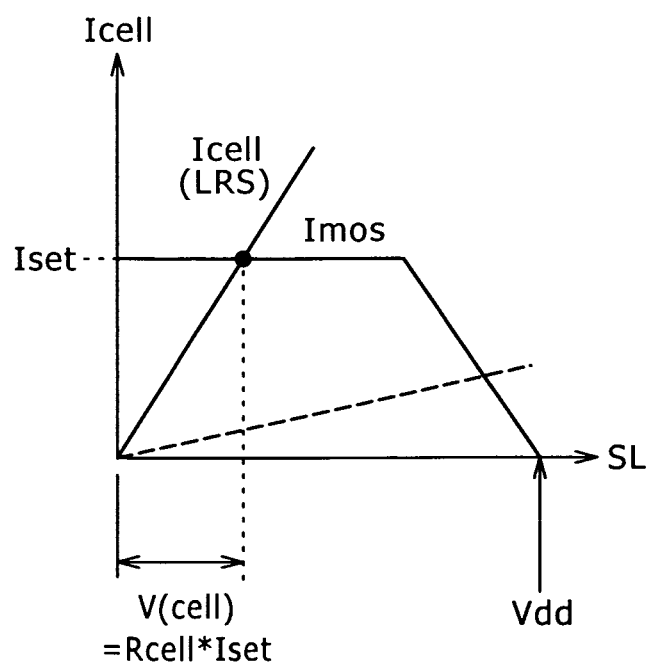

FIG. 22B is a diagram showing characteristics for a state in which the memory element has been inverted to a low-resistance state LRS after the end of the set operation.

FIG. 22B is a diagram corresponding to FIG. 15B provided for the first embodiment. However, the postures of the MOS-transistor drain saturation characteristic curve and the load straight line with respect to the increasing direction of the electric potential of the common line in FIG. 22B is opposite to those of FIG. 15B.

Nevertheless, the second embodiment is identical with the first embodiment in that, after the set operation has been completed, the magnitude of the voltage stress is reduced and an excessively large current stress is not applied to the memory cell MC due to the operation of a current limiter making use of the saturation characteristic.

Figure 23:
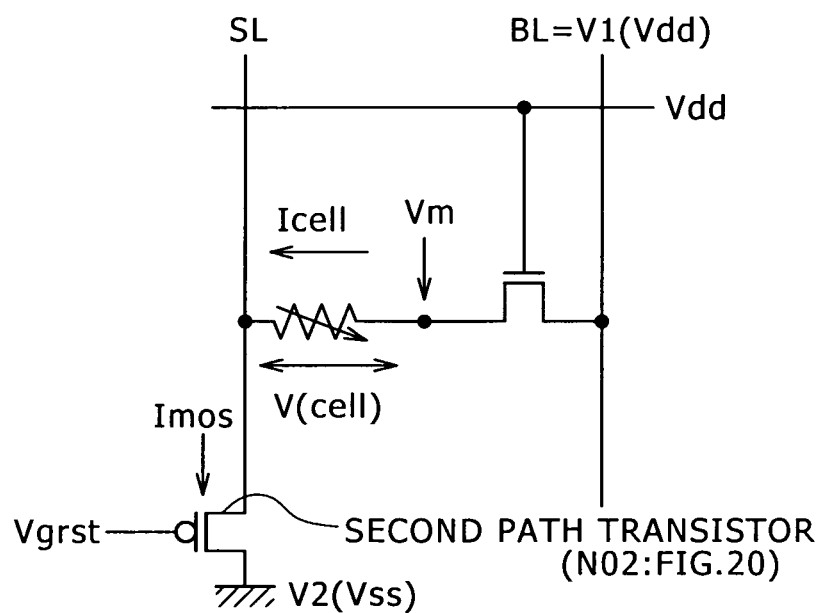
FIG. 23 is a diagram showing an equivalent circuit for a reset operation carried out in the second embodiment.

FIG. 23 is a diagram showing an equivalent circuit for a reset operation in the second embodiment.

In the equivalent circuit shown in FIG. 23, the second path transistor denoted by reference symbol N02 in FIG. 20 is a PMOS transistor obtained by changing an NMOS transistor employed in the equivalent circuit shown in FIG. 16. In addition, the second voltage V2 is the reference voltage Vss which is a voltage set at a low level.

Since the access transistor AT is operating at a sufficiently low impedance, it is assumed that a voltage drop along the access transistor AT can be ignored.

Figure 24A:
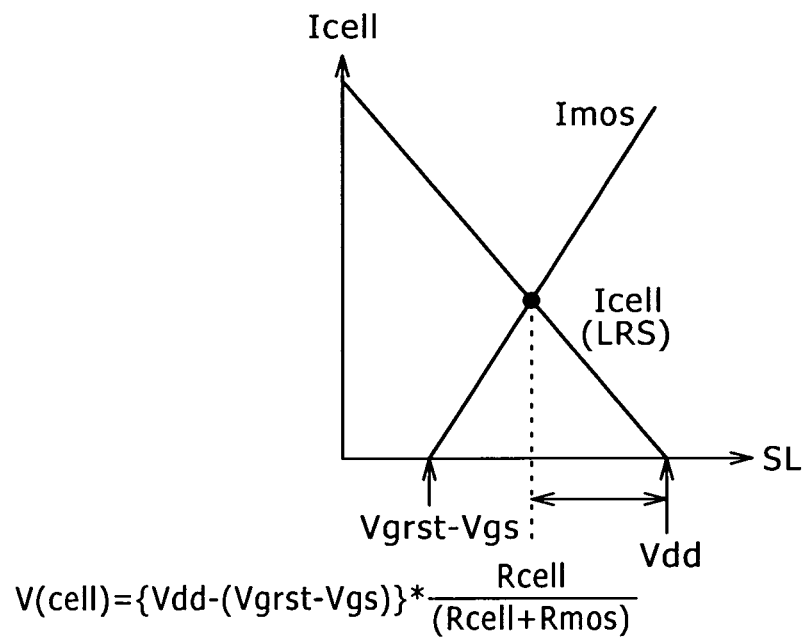
FIGS. 24A and 24B are a plurality of diagrams showing load characteristics right after the start of the reset operation and the end of the operation in the second embodiment.

FIG. 24A is a diagram showing a load characteristic exhibited right after the start of the reset operation when the memory cell MC is still in a low-resistance state LRS. To be more specific, the figure shows a characteristic curve of a current Imos flowing through the NMOS transistor and a load straight line of a cell current Icell.

It is to be noted, accompanying the change to a driving method of drawing out a current from the memory cell MC by making use of the second path transistor, in comparison with the characteristic shown in FIG. 17A, the postures of the MOS-transistor drain saturation characteristic curve and the load straight line with respect to the increasing direction of the electric potential of the common line in FIG. 24A is opposite to those of FIG. 17A.

The second embodiment is similar to the first embodiment, however, in that a relatively large current stress shown in FIG.

24A is a transient stress and required as a trigger for inversion to a low-resistance state LRS so that the stress does not give rise to characteristic deteriorations.

Figure 24B:
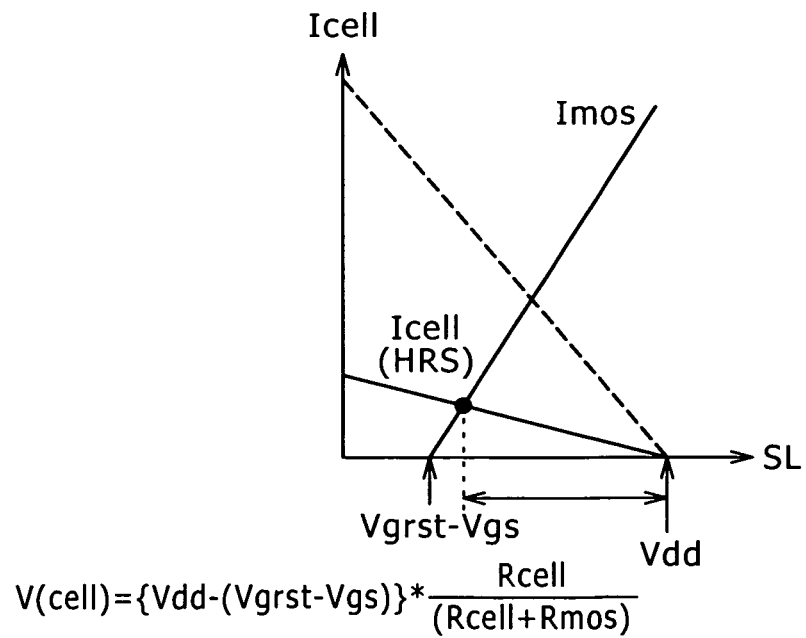

FIG. 24B is a diagram showing a load characteristic exhibited right after the end of the reset operation when the memory cell MC has already been changed to a high-resistance state HRS.

Even though the current stress is reduced after the end of the reset operation, the voltage stress increases. However, this voltage stress is limited by a limiter based on the reset gate voltage Vgrst applied to the gate electrode of the second path transistor. On top of that, this voltage is actually a voltage lower than the reset gate voltage Vgrst by a voltage difference equal to the gate-source voltage Vgs and gives rise to a small voltage stress equal in a magnitude to a stress caused by a fraction of the voltage of the power supply. Thus, this voltage does not give rise to a voltage stress causing a characteristic deterioration. In this case, the characteristic of the second embodiment is identical with that shown in FIG. 17B given for the first embodiment.

As is obvious from the first and second embodiments described above, the present disclosure can be applied to configurations in which both NMOS and PMOS transistors are used as the first and second path transistors.

It is to be noted that the configurations shown in FIGS. 10 and 20 as the configurations of the set/reset driver 10 are each a typical configuration. The set/reset driver 10 may adopt any other configuration as long as, in the other configuration, a first common line is connected to a first-voltage supplying line for supplying a first voltage whereas a second common line is connected to a second-voltage supplying line for supplying a second voltage different from the first voltage.

By adoption of such a configuration, a specific one of the set and reset operations is carried out as a drain output operation whereas the other one of the set and reset operations is carried out as a source follower operation and it is thus possible to implement a driving circuit capable of switching the operation from the set operation to the reset operation and vice versa with ease.

In addition, each of the first and second embodiments explained above is provided for a case in which the variable-resistance element is a ReRAM. However, the present disclosure can also be applied to another variable-resistance memory device exhibiting set-operation and reset-operation resistance changes greater than those of typically the spin injection method. Also in the case of a spin RAM adopting the spin injection method, there is an effect of application of the present disclosure provided that the magnitude of the resistance change is so large that the operating point moves to the linear area, that is, the unsaturated area.

In these cases, it is desirable to provide a configuration in which the memory element is a variable-resistance element having a resistance changing by such a large quantity that operating points in the set and reset operations of the first or second path transistor make transitions between saturated and unsaturated areas of the first or second path transistor.

Other memories to which the present disclosure can be applied are explained as follows:

The present disclosure can also be applied to a conductive memory in which a resistance changes due to movements of metal ions made from a chalcogenide base material. A typical example of such a conductive memory is an ARAM.

The present disclosure can also be applied to a memory in which a resistance changes to accompany movements of oxygen ions in a transition metal oxide film.

The present disclosure can also be applied to a memory in which a resistance changes due to the use of a magnetic material. A typical example of such a memory is an MRAM including a spin RAM.

From another point of view, the present disclosure can also be applied to a wide range of bipolar memories in which a resistance changes due to inversion of the polarity of a voltage applied to the memory. The bipolar memories include the ReRAM, the MRAM (including the spin RAM) and other memories.

In addition, the present disclosure can also be applied to all other memories in which a resistance changes much so as to exhibit the effect of the present disclosure even if the other memories have a resistance-change mechanism different from those of the memories described above. The effect of the present disclosure is the reduction of stress.

The present disclosure contains subject matter related to that disclosed in Japanese Priority Patent Application JP 2010-164380 filed in the Japan Patent Office on Jul. 21, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A variable-resistance memory device comprising:
a memory cell including a memory element being variable in resistance in accordance with a polarity of an application voltage applied to said memory element in a set or a reset operation and an access transistor connected to said memory element in series between a first common line and a second common line; and
a driving circuit including a third control transistor connected between said first common line and a first path transistor, a fourth control transistor connected between a second supply line for supplying a second voltage and a second path transistor, said first path transistor connected between a first supply line for supplying a first voltage and said third control transistor, and said second path transistor connected between a second supply line for supplying a second voltage and said first common line,
wherein said driving circuit controls a voltage applied to a gate electrode of said first path transistor, a voltage applied to a gate electrode of said second path transistor and a voltage appearing on said second common line so as to drive said first path transistor to carry out a drain output operation when said application voltage is applied to said memory element to execute said set operation and drive said second path transistor to carry out a source follower operation when said application voltage is applied to said memory element to execute said reset operation.

2. The variable-resistance memory device according to claim 1, wherein said memory element is a variable-resistance element having a resistance changing by such a large quantity that operating points in said set operation and reset operation of said first path transistor or said second path transistor make transitions between saturated and unsaturated areas of said first path transistor or said second path transistor.

3. The variable-resistance memory device according to claim 2, said variable-resistance memory device including a configuration wherein:
a plurality of said memory cells having said access transistor controlled at a same time are provided;

a common-line pair consisting of said first common line and said second common line is provided for each of said plurality of said memory cells; and said driving circuit is capable of controlling said voltage applied to said gate electrode of said first path transistor, said voltage applied to said gate electrode of said second path transistor and said voltage appearing on said second common line independently for each of said memory cells.

4. The variable-resistance memory device according to claim 3, said variable-resistance memory device including a configuration wherein said driving circuit is capable of executing control to carry out said set operation of one or more memory cells of said plurality of memory cells and said reset operation of remaining memory cells of said plurality of memory cells during same period or overlapping periods.

5. The variable-resistance memory device according to claim 3, wherein each of said first path transistor and said second path transistor included in said driving circuit is an insulated-gate transistor of a first conduction type.

6. The variable-resistance memory device according to claim 5, wherein said second voltage is higher than said first voltage.

7. The variable-resistance memory device according to claim 6, wherein said driving circuit includes:
a first control transistor of second conduction type for applying a voltage higher than said first voltage or said second voltage to said second common line in said set operation; and
a second control transistor of said first conduction type for applying a voltage lower than said second voltage or said first voltage to said second common line in said reset operation.

8. The variable-resistance memory device according to claim 1, wherein each of said first path transistor and said second path transistor included in said driving circuit is an insulated-gate transistor of a second conduction type.

9. The variable-resistance memory device according to claim 8, wherein said first voltage is higher than said second voltage.

10. The variable-resistance memory device according to claim 9, wherein said driving circuit includes:
a first control transistor of first conduction type for applying a voltage lower than said first voltage or said second voltage to said second common line in said set operation; and
a second control transistor of second conduction type for applying a voltage higher than said second voltage or said first voltage to said second common line in said reset operation.

11. The variable-resistance memory device according to claim 10, wherein said driving circuit includes:
a source electrode of said first path transistor of second conduction type connected to said first supply line;
said third control transistor of second conduction type connected between a drain electrode of said first path transistor of second conduction type and said first common line;
a drain electrode of said second path transistor of second conduction type connected to said first common line;
said fourth control transistor of first conduction type connected between a source electrode of said second path transistor of second conduction type and said second supply line; and
a data input section configured to drive a pair composed of said first control transistor and said third control transistor as well as a pair composed of said second control transistor and said fourth control transistor to carry out differential operations respectively in accordance with logic of input data.

12. The variable-resistance memory device according to claim 1, wherein said set operation is an operation to reduce said resistance of said memory element and said reset operation is an operation to raise said resistance of said memory element.

13. The variable-resistance memory device according to claim 1, wherein:
said memory cell is a variable-resistance memory cell having a conductive-ion supplying layer and a variable-resistance layer, which is brought into contact with said conductive-ion supplying layer, between two electrodes; and
in accordance with said polarity of a voltage applied between said two electrodes, conductive ions are injected from said conductive-ion supplying layer into said variable-resistance layer or said conductive ions already injected into said variable-resistance layer are returned to said conductive-ion supplying layer.

14. The variable-resistance memory device according to claim 1, wherein, in said set operation or said reset operation, a predetermined voltage capable of putting said access transistor in a turned-on state is applied to a gate electrode of said access transistor.

15. A method for driving a variable-resistance memory device, said method comprising:
in a memory cell comprising a memory element:
varying resistance of said memory element in accordance with a polarity of an application voltage applied to said memory element in a set operation or a reset operation;
in a driving circuit:
performing a drain output operation by said first path transistor when said application voltage is applied to said memory element to execute said set operation; and
performing a source follower operation by said second path transistor when said application voltage is applied to said memory element to execute said reset operation,
wherein said drain output operation or said source follower operation is determined by controlling voltage applied to: a gate electrode of a first path transistor, a gate electrode of a second path transistor, a gate electrode of a third control transistor, a gate electrode of a fourth control transistor and a second common line.

16. The method for driving said variable-resistance memory device in accordance with claim 15, wherein said memory element is a variable-resistance element having a resistance changing by such a large quantity that operating points in said set operation and said reset operation of said first path transistor or said second path transistor make transitions between saturated and unsaturated areas of said first path transistor or said second path transistor.

17. The method for driving said variable-resistance memory device in accordance with claim 15, wherein:
in said drain output operation carried out by said first path transistor, an operation to apply said second voltage to said first common line through said second path transistor is stopped;
in said source follower operation carried out by said second path transistor, an operation to apply said first voltage to said first common line through said first path transistor is stopped.

18. The method for driving said nonvolatile variable-resistance memory device in accordance with claim 15, wherein, for a memory-cell array comprising a plurality of said memory cells, a time period of said set operation carried out on one or more of memory elements pertaining to said memory-cell array and a time period of said reset operation carried out on one or more of other memory elements pertaining to said memory-cell array are same period or periods overlapping each other.

19. A variable-resistance memory device comprising:
a memory cell including a memory element being variable in resistance in accordance with a polarity of an application voltage applied to said memory element in a set or a reset operation and an access transistor connected to said memory element in series between a first common line and a second common line; and
a driving circuit including a third control transistor connected between said first common line and a first path transistor, a fourth control transistor connected between a second supply line for supplying a second voltage and a second path transistor, said first path transistor connected between a first supply line for supplying a first voltage and said third control transistor, and said second path transistor connected between a second supply line for supplying a second voltage and said first common line,
wherein said driving circuit controls a voltage applied to a gate electrode of said first path transistor, a voltage applied to a gate electrode of said second path transistor and a voltage appearing on said second common line so as to drive said first path transistor to carry out a drain output operation when said application voltage is applied to said memory element to execute said set operation and drive said second path transistor to carry out a source follower operation when said application voltage is applied to said memory element to execute said reset operation,
wherein said driving circuit comprises:
said first path transistor of first conduction type having its source electrode connected to said first supply line;
said third control transistor of first conduction type connected between a drain electrode of said first path transistor and said first common line;
a drain electrode of said second path transistor of first conduction type connected to said first common line;
said fourth control transistor connected between a source electrode of said second path transistor and said second supply line; and
a data input section configured to drive a pair composed of a first control transistor and said third control transistor as well as a pair composed of a second control transistor and said fourth control transistor to carry out differential operations respectively in accordance with logic of input data.

* * * * *